US009462693B2

(12) United States Patent
Okamoto et al.

(10) Patent No.: US 9,462,693 B2
(45) Date of Patent: Oct. 4, 2016

(54) ELECTRONIC DEVICE AND METHOD OF MANUFACTURING ELECTRONIC DEVICE

(71) Applicant: FUJITSU LIMITED, Kawasaki-shi, Kanagawa (JP)

(72) Inventors: Keishiro Okamoto, Ebina (JP); Seiki Sakuyama, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 70 days.

(21) Appl. No.: 14/455,204

(22) Filed: Aug. 8, 2014

(65) Prior Publication Data

US 2015/0049450 A1 Feb. 19, 2015

(30) Foreign Application Priority Data

Aug. 19, 2013 (JP) .................. 2013-169476

(51) Int. Cl.
*H05K 1/18* (2006.01)
*H05K 3/34* (2006.01)
(Continued)

(52) U.S. Cl.
CPC ............. *H05K 1/181* (2013.01); *B23K 1/20* (2013.01); *H01L 21/50* (2013.01); *H01L 23/04* (2013.01); *H01L 23/49816* (2013.01); *H01L 23/49838* (2013.01); *H01L 24/16* (2013.01); *H01L 24/81* (2013.01); *H01L 24/92* (2013.01); *H05K 3/303* (2013.01); *H05K 3/34* (2013.01); *H01L 23/3675* (2013.01); *H01L 23/4006* (2013.01); *H01L 24/13* (2013.01); *H01L 24/29* (2013.01); *H01L 24/32* (2013.01); *H01L 24/75* (2013.01); *H01L 24/83* (2013.01); *H01L 2224/10135* (2013.01); *H01L 2224/10165* (2013.01);

(Continued)

(58) Field of Classification Search
CPC ...... H05K 3/34; H05K 3/341; H05K 3/3415; H05K 3/3421; H05K 3/3426; H05K 3/3431; H05K 3/3436; H05K 3/3442; H05K 1/181
See application file for complete search history.

(56) References Cited

U.S. PATENT DOCUMENTS 5,634,268 A * 6/1997 Dalal ................. H01L 23/5384
228/180.22
6,087,597 A * 7/2000 Shimada .......... H01L 23/49572
174/263

(Continued)

FOREIGN PATENT DOCUMENTS

EP 0463297 A1 1/1992

OTHER PUBLICATIONS

European Office Action dated Jan. 7, 2015 in corresponding European Patent Application No. 14180520.0.

*Primary Examiner* — Jeremy C Norris
(74) *Attorney, Agent, or Firm* — Kratz, Quintos & Hanson, LLP

(57) ABSTRACT

An electronic device includes: a first electronic component; first members that are provided on a first surface of the first electronic component and that include outside surfaces configured to face diagonally upward with respect to the first surface; a second electronic component provided above the first surface; second members that are provided corresponding to the first members on a second surface of the second electronic component which faces the first surface and that include inside surfaces configured to face diagonally downward with respect to the second surface and configured to face the outside surfaces; and solder that is provided between the first surface and the second surface and that electrically connects the first electronic component and the second electronic component.

14 Claims, 14 Drawing Sheets

(51) Int. Cl.
  *B23K 1/20*      (2006.01)
  *H01L 23/00*     (2006.01)
  *H05K 3/30*      (2006.01)
  *H01L 23/498*    (2006.01)
  *H01L 23/04*     (2006.01)
  *H01L 21/50*     (2006.01)
  *H05K 1/02*      (2006.01)
  *H01L 23/367*    (2006.01)
  *H01L 23/40*     (2006.01)

(52) U.S. Cl.
  CPC ............ *H01L 2224/131* (2013.01); *H01L 2224/16058* (2013.01); *H01L 2224/16225* (2013.01); *H01L 2224/16227* (2013.01); *H01L 2224/171* (2013.01); *H01L 2224/291* (2013.01); *H01L 2224/2919* (2013.01); *H01L 2224/29294* (2013.01); *H01L 2224/29339* (2013.01); *H01L 2224/32225* (2013.01); *H01L 2224/32245* (2013.01); *H01L 2224/73253* (2013.01); *H01L 2224/75252* (2013.01); *H01L 2224/75745* (2013.01); *H01L 2224/81007* (2013.01); *H01L 2224/81141* (2013.01); *H01L 2224/81191* (2013.01); *H01L 2224/81815* (2013.01); *H01L 2224/81907* (2013.01); *H01L 2224/8388* (2013.01); *H01L 2224/83192* (2013.01); *H01L 2224/83862* (2013.01); *H01L 2224/92* (2013.01); *H01L 2224/9221* (2013.01); *H01L 2924/15311* (2013.01); *H01L 2924/16152* (2013.01); *H05K 1/0271* (2013.01); *H05K 3/305* (2013.01); *H05K 3/3436* (2013.01); *H05K 2201/068* (2013.01); *H05K 2201/2036* (2013.01); *Y02P 70/613* (2015.11)

(56) References Cited

U.S. PATENT DOCUMENTS

| | | |
|---|---|---|
| 7,135,771 B1 | 11/2006 | Khandekar et al. |
| 7,557,452 B1* | 7/2009 | Williams .......... H01L 23/49811 257/697 |
| 2009/0127704 A1 | 5/2009 | Lee |
| 2013/0341802 A1* | 12/2013 | Su ................... H01L 21/563 257/774 |

* cited by examiner

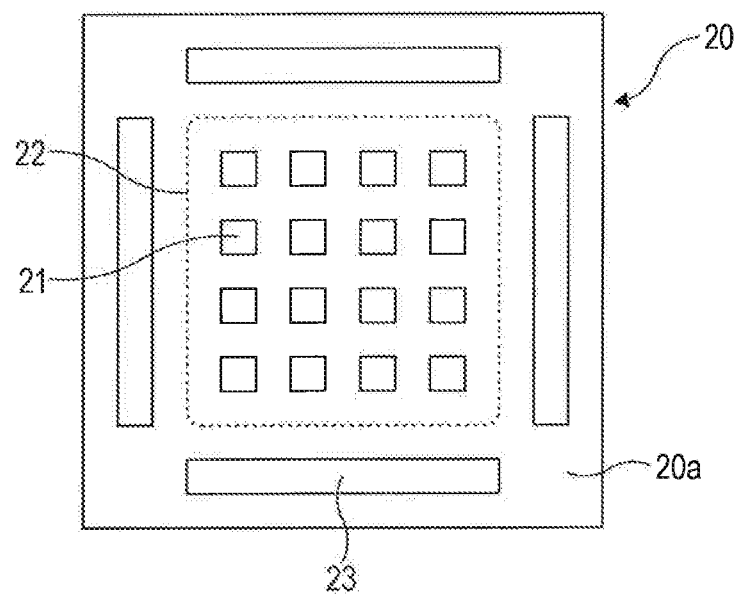
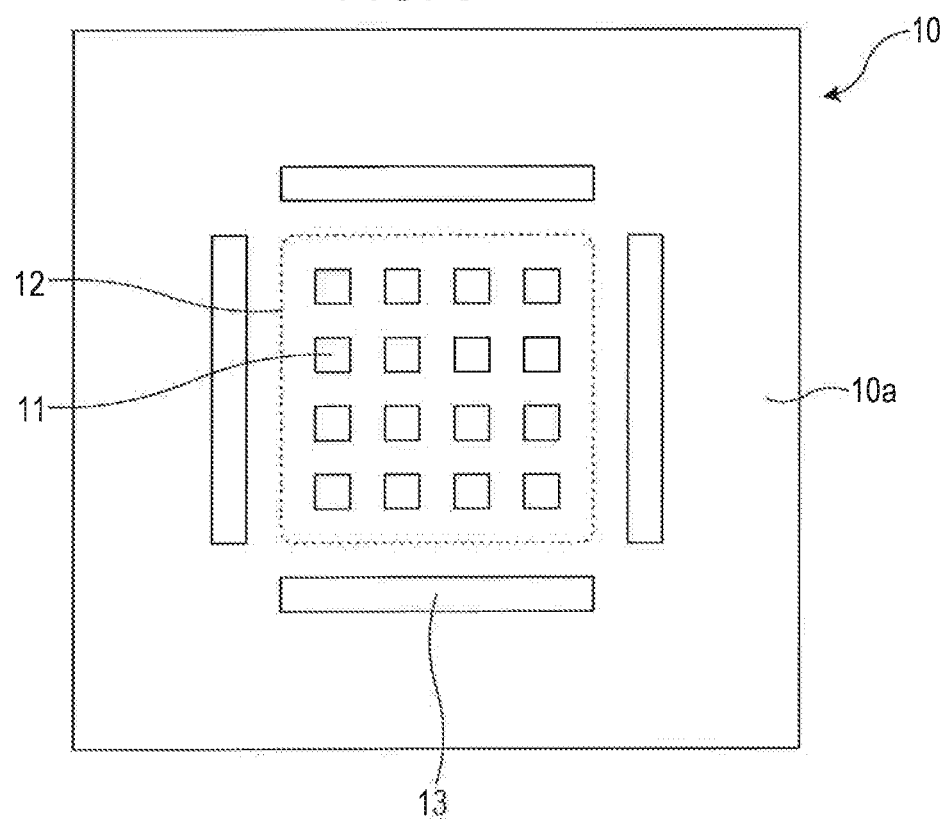

ELECTRONIC DEVICE AND METHOD OF MANUFACTURING ELECTRONIC DEVICE

CROSS-REFERENCE TO RELATED APPLICATION

This application is based upon and claims the benefit of priority of the prior Japanese Patent Application No. 2013-169476, filed on Aug. 19, 2013, the entire contents of which are incorporated herein by reference.

FIELD

The embodiments discussed herein are related to an electronic device and a method of manufacturing the electronic device.

BACKGROUND

Techniques in which electronic components are joined with the use of solder with spacers provided with a specific height and interposed therebetween have been known. For instance, a technique for an electronic device in which a semiconductor device (semiconductor package) and a substrate are joined with the use of solder and in which spacers (which may be referred to as stand-off members, supporting members, or the like) are interposed between the semiconductor device and the substrate has been known.

Japanese Laid-open Patent Publication No. 2000-332473 and Japanese Laid-open Patent Publication No. 2006-237369 are examples of related art.

By the interposition of spacers between electronic components that are joined with the use of solder, a gap between the electronic components may be restrained from becoming smaller than a specified value and occurrence of squashing of solder joints, short circuits between adjoining solder joints, and the like may be restrained.

When contact is made between the spacers and the electronic components after the solder joining with the provision of the spacers, however, there is fear that stresses, strain, and the like caused by the contact may cause a decrease in connection strength in the solder joints, a decrease in reliability of connection between the electronic components, and the like.

SUMMARY

According to an aspect of the invention, an electronic device includes: a first electronic component; first members that are provided on a first surface of the first electronic component and that include outside surfaces configured to face diagonally upward with respect to the first surface; a second electronic component provided above the first surface; second members that are provided corresponding to the first members on a second surface of the second electronic component which faces the first surface and that include inside surfaces configured to face diagonally downward with respect to the second surface and configured to face the outside surfaces; and solder that is provided between the first surface and the second surface and that electrically connects the first electronic component and the second electronic component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6A and FIG. 6B illustrate a second example of arrangement of the spacers.

DESCRIPTION OF EMBODIMENTS

Initially, solder joining of electronic components will be described.

Figure 1:
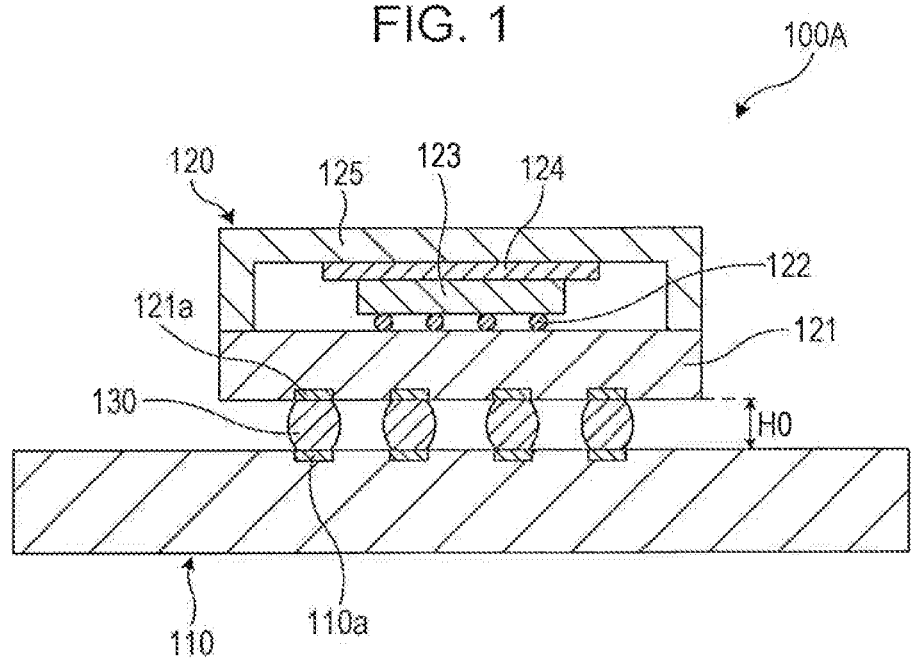
FIG. 1 illustrates an example of an electronic device.

FIG. 1 illustrates an example of an electronic device. FIG. 1 is a schematic sectional view of a main part of the example of the electronic device.

The electronic device 100A illustrated in FIG. 1 has a wiring substrate 110 and a semiconductor device 120 that are the electronic components, and solder bumps 130 that electrically connect the wiring substrate 110 and the semiconductor device 120.

The wiring substrate 110 has electrodes 110a to which the solder bumps 130 are joined. The wiring substrate 110 further has wiring that is provided with a specified pattern and that is electrically connected to the electrodes 110a and conductive parts (not illustrated) such as vias that provide electrical connection between different wires in the wiring.

The semiconductor device 120 includes a package substrate (wiring substrate) 121 and a semiconductor chip 123 such as large scale integration (LSI) flip-chip bonded to the package substrate 121 with the use of solder bumps 122. The package substrate 121 has electrodes 121a which are provided at positions corresponding to the electrodes 110a on the wiring substrate 110 and to which the solder bumps 130 are joined. The package substrate 121 further has wiring that is provided with a specified pattern and that is electrically connected to the electrodes 121a and conductive parts (not illustrated) such as vias that provide electrical connection between different wires in the wiring.

The semiconductor device 120 includes a lid 125 provided above the semiconductor chip 123 with a joint member 124 therebetween. The lid 125 that is shaped so as to cover the semiconductor chip 123 may be used. The lid 125 is capable of functioning as a protecting member that protects the semiconductor chip 123. With the use of a material exhibiting thermal conductivity for the lid 125, furthermore, the lid 125 is capable of functioning as a heat dissipating member that dissipates heat generated in the semiconductor chip 123. In an example provided with a heat sink not illustrated herein above the lid 125, the lid 125 is capable of functioning as a heat transferring member that transfers to the heat sink heat generated in the semiconductor chip 123.

For manufacture of the electronic device 100A with such a configuration as described above, initially, the wiring substrate 110 and the semiconductor device 120 are prepared. The solder bumps 130 such as solder balls are provided on the electrodes 121a of the package substrate 121 in the prepared semiconductor device 120. The semiconductor device 120 is placed above the wiring substrate 110 so that a surface of the semiconductor device 120 provided with the electrodes 121a and the solder bumps 130 faces a surface of the wiring substrate 110 provided with the electrodes 110a. Then the semiconductor device 120 is mounted on the wiring substrate 110 with positioning attained between the electrodes 121a and the electrodes 110a. After that, the solder bumps 130 are melted by being heated at a temperature higher than the melting point of the solder bumps 130. After being melted, the solder bumps 130 are solidified by being cooled. As a result, the electrodes 121a of the semiconductor device 120 and the electrodes 110a of the wiring substrate 110 are joined (soldered) by the solder bumps 130. With the soldering, a gap (height of the solder bumps 130 after the joining) HO between the semiconductor device 120 and the wiring substrate 110 reaches (is decreased to) a given height with which surface tension of the solder bumps 130 in a melted state and weight of the semiconductor device 120 are balanced.

Thus the electronic device 100A in which the semiconductor device 120 and the wiring substrate 110 are electrically connected through the solder bumps 130 is manufactured.

With improvement in performance of electronic equipment in which such an electronic device as the electronic device 100A is mounted, a decrease in size of the solder bumps 130, an increase in size of the package substrate 121, an increase in weight of the semiconductor device 120, and the like cause an increase in amount of squashing of the solder bumps 130 during the soldering. The increase in the amount of squashing of the solder bumps 130 results in a decrease in the gap HO between the semiconductor device 120 and the wiring substrate 110. Furthermore, the gap HO for the solder bumps 130 at joint surfaces may become uneven. In a case where an increase in the amount of squashing of the solder bumps 130 results in a decrease in the gap HO or causes the gap HO to become uneven at the joint surfaces, contact between adjacent solder bumps 130 may cause a short circuit. In a case where a decrease is caused in the gap HO between the package substrate 121 and the wiring substrate 110 that differ in terms of coefficient of thermal expansion, insufficient relief of shearing stresses exerted on the solder bumps 130 may result in deterioration in fatigue resistance.

In some devices, therefore, spacers with a specified height are provided between the package substrate 121 and the wiring substrate 110 in order to ensure that the gap HO is of a fixed size.

Figure 2:
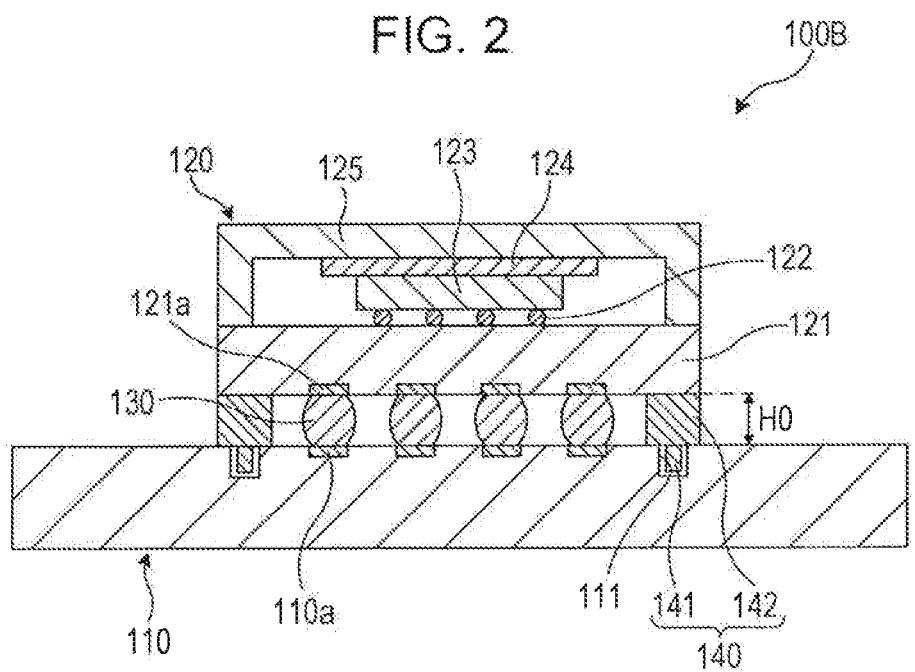
FIG. 2 illustrates another example of an electronic device.

FIG. 2 illustrates another example of an electronic device. FIG. 2 is a schematic sectional view of a main part of the other example of an electronic device.

The electronic device 100B illustrated in FIG. 2 is different from the electronic device 100A illustrated in FIG. 1 in that stand-off members 140 with a specified height are provided as spacers between the package substrate 121 of the semiconductor device 120 and the wiring substrate 110. Presented as an example herein are the stand-off members 140 that have insert parts 141 to be inserted into holes 111 provided on the wiring substrate 110 and stand-off parts 142 with a height set based on the gap HO provided between the package substrate 121 and the wiring substrate 110. A single member corresponding to the stand-off parts 142 may be prepared and may be used as a spacer provided between the package substrate 121 and the wiring substrate 110.

With the stand-off members 140 provided between the package substrate 121 and the wiring substrate 110 as in the electronic device 100B, the semiconductor device 120 may be supported by the stand-off members 140 and thus forces exerted on the solder bumps 130 may be reduced. In addition, the height of the solder bumps 130 may be restrained from being smaller than the height of the stand-off parts 142 so that the gap HO of a specified size may be ensured.

When the electrodes 121a on the package substrate 121 of the prepared semiconductor device 120 and the electrodes 110a on the wiring substrate 110 are soldered through the solder bumps 130 with the use of the stand-off members 140, however, the package substrate 121 and the stand-off members 140 may be brought into contact with each other. The contact between the package substrate 121 and the stand-off members 140 after the soldering may cause stresses, strain, and the like in the package substrate 121. There is a risk that the stresses, strain, and the like may influence the solder joints and may result in a decrease in connection strength in the solder joints, deterioration in the fatigue resistance, and the like.

The package substrate 121 is formed with the use of a metal material such as copper for the electrodes 121a and the conductive parts (wiring and vias) and with the use of a resin material for insulating parts, for instance. The package substrate 121 formed of such a plurality of types of materials may undergo deformation such as warping. The tolerable margin for deformation such as warping in the package substrate 121 on which the semiconductor chip 123 is mounted has been decreased by the increase in size of integrated circuits on the semiconductor chip 123, the decrease in pitch of the solder bumps 130, and the like. In a case where a solder material with a comparatively high melting point is used for the solder bumps 130 under conditions of the increased size and decreased thickness of the package substrate 121 or the decreased size of the solder bumps 130, deformation exceeding the tolerable margin may be caused in the package substrate 121 by heating performed in the soldering for melting the solder material. There is a risk that such deformation in the package substrate 121 may bring about a state in which the electrodes 121a and the solder bumps 130 are no longer connected and may cause defective joining (open failure) between the wiring substrate 110 and the package substrate 121.

In one of methods of reducing the deformation of the package substrate 121 in the soldering, a solder material with a comparatively low melting point is used for the solder bumps 130. For instance, the material of the solder bumps 130 is changed from a tin-silver-copper (Sn—Ag—Cu) based solder material to a tin-bismuth (Sn—Bi) based solder material with a lower melting point. However, such a solder material with a comparatively low melting point tends to have a lower surface tension in a melted state than a solder material with a comparatively high melting point. Accordingly, the solder bumps 130 that use such a solder material with a comparatively low melting point are prone to being squashed in the soldering, so that the gap HO between the package substrate 121 and the wiring substrate 110 is prone to being narrowed. In order to ensure that the gap HO is of a fixed size, it is preferable to use spacers such as stand-off members. In that case, however, there is a possibility that stresses, strain, and the like may be caused in the package substrate 121 by the contact between the package substrate 121 and the spacers, as described above. As a result, a decrease in the connection strength in the solder joints, a deterioration in the fatigue resistance, and the like may be caused.

In consideration of the above, herein, electronic devices are obtained with the use of techniques that will be presented below as examples of embodiments.

Initially, a first embodiment will be described.

Figure 3A:
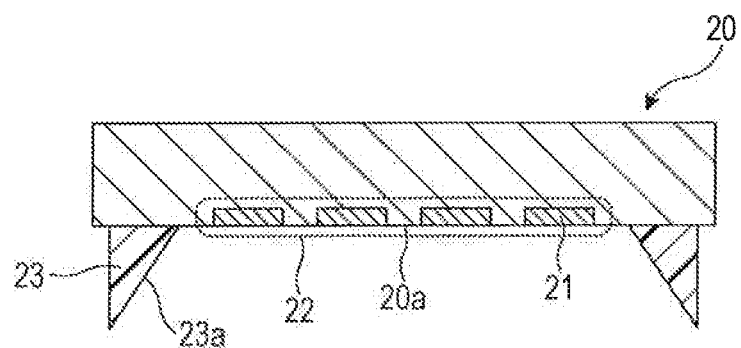
FIG. 3A and FIG. 3B illustrate an example of electronic components that are used for an electronic device according to a first embodiment.
Figure 3B:
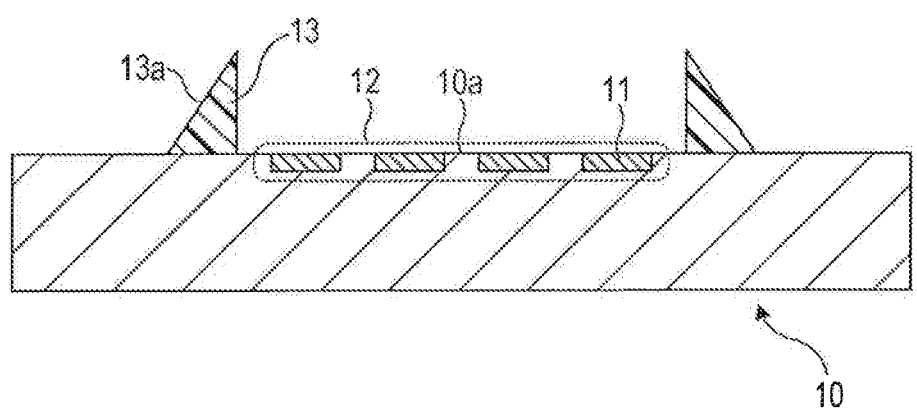

FIG. 3 illustrates an example of electronic components that are used for an electronic device according to the first embodiment. FIG. 3A and FIG. 3B are schematic sectional views of main parts of the example of the electronic components.

In FIG. 3A and FIG. 3B, the electronic component 20 and the electronic component 10 that are to be joined with the use of solder bumps are respectively illustrated as the example. The electronic component 20 illustrated in FIG. 3A has electrodes 21 to which the solder bumps are to be joined, on a surface (bottom surface) 20a thereof. Herein, the plurality of electrodes 21 are illustrated as an example. The electronic component 10 illustrated in FIG. 3B has electrodes 11 to which the solder bumps are to be joined, on a surface (top surface) 10a thereof. Herein, the plurality of electrodes 11 are illustrated as an example. The electrodes 21 on the electronic component 20 and the electrodes 11 on the electronic component 10 are provided at positions corresponding to each other.

The electronic component 20 illustrated in FIG. 3A and the electronic component 10 illustrated in FIG. 3B differ in terms of coefficient of thermal expansion (degree of thermal expansion). Herein, the coefficient of thermal expansion of the electronic component 20 illustrated in FIG. 3A is assumed to be smaller than the coefficient of thermal expansion of the electronic component 10 illustrated in FIG. 3B.

The electronic component 20 of FIG. 3A with the comparatively small coefficient of thermal expansion has spacers 23 having inside surfaces 23a facing diagonally downward with respect to the bottom surface 20a and inward in directions along a plane of the electronic component 20, outside a region 22 (illustrated by a dotted line frame in FIG. 3A) on the bottom surface 20a in which the electrodes 21 are provided. On the other hand, the electronic component 10 of FIG. 3B with the comparatively large coefficient of thermal expansion has spacers 13 having outside surfaces 13a facing diagonally upward with respect to the top surface 10a and outward in directions along a plane of the electronic component 10, outside a region 12 (illustrated by a dotted line frame in FIG. 3B) on the top surface 10a in which the electrodes 11 are provided. On the electronic component 20 and the electronic component 10 that are not yet joined, the spacers 23 (at least the inside surfaces 23a) and the spacers 13 (at least the outside surfaces 13a) are respectively provided at positions corresponding to each other.

Figure 4A:
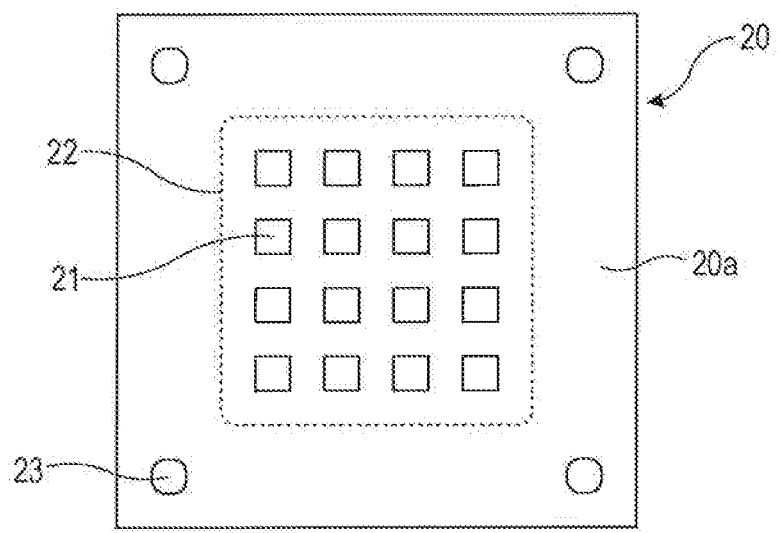
FIG. 4A and FIG. 4B illustrate a first example of arrangement of spacers.
Figure 4B:
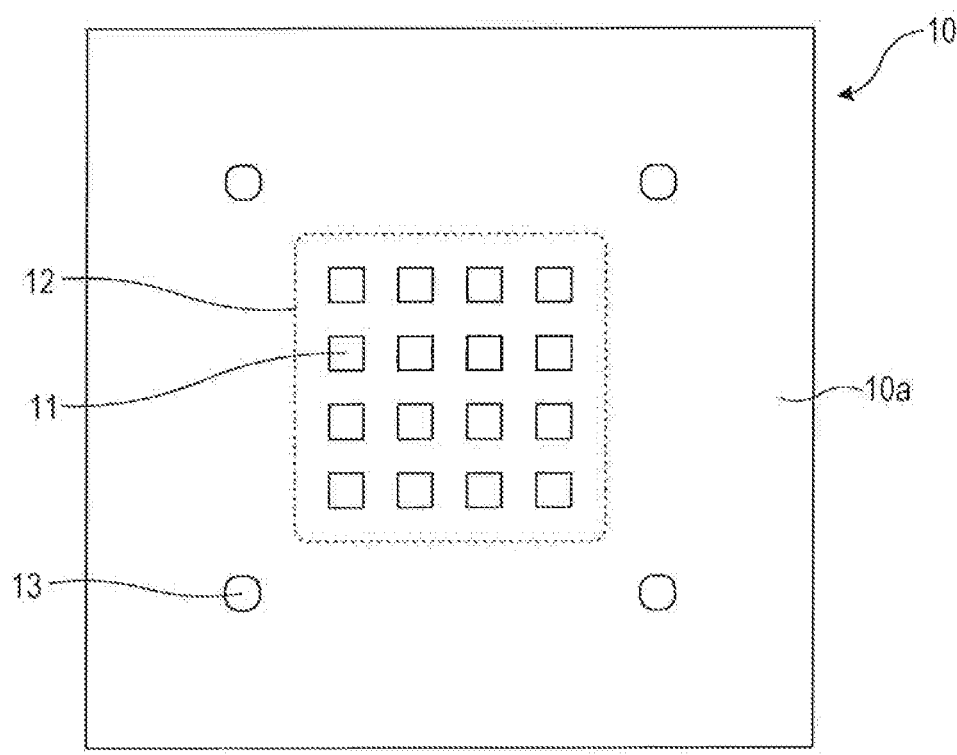
Figure 5A:
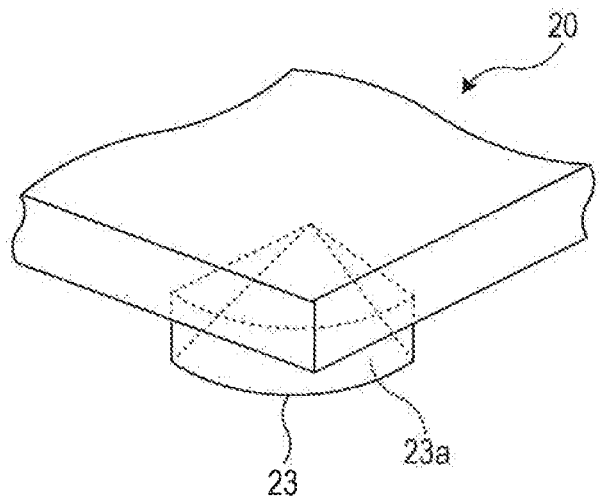
FIG. 5A and FIG. 5B illustrate a first example of configuration of the spacers.
Figure 5B:
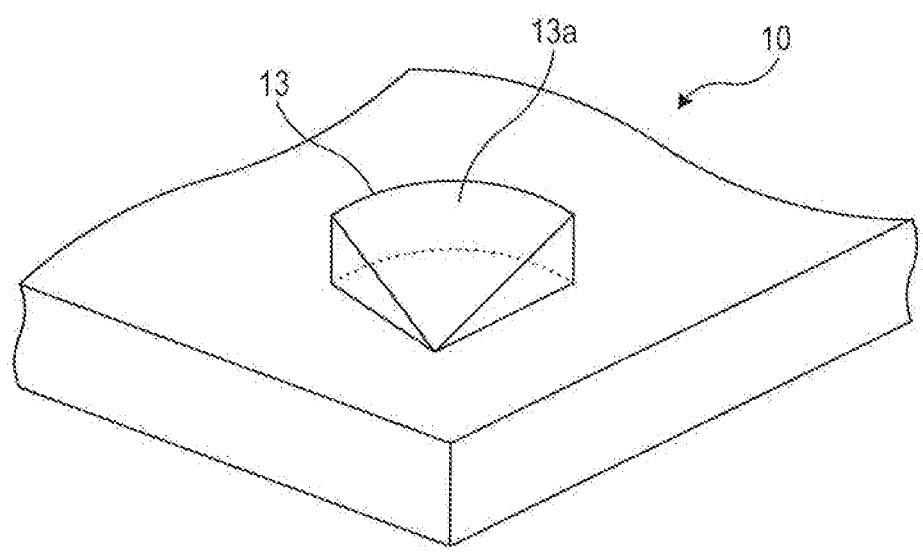

FIG. 4 illustrates a first example of arrangement of the spacers, and FIG. 5 illustrates a first example of configuration of the spacers. FIGS. 4A and 4B are schematic plan views of main parts of the electronic components as seen from the side of the surfaces on which the spacers are arranged. FIGS. 5A and 5B are schematic perspective views of main parts of the electronic components on which the spacers are arranged.

As illustrated in FIG. 4A, the spacers 23 on the electronic component 20 may be provided at positions corresponding to four corners of the region 22 (illustrated by the dotted line frame in FIG. 4A) on the bottom surface 20a, in which the electrodes 21 are provided, so that the spacers 23 may surround the region 22. As illustrated in FIG. 4B, similarly, the spacers 13 on the electronic component 10 that are provided corresponding to the spacers 23 may be provided at positions corresponding to four corners of the region 12 (illustrated by the dotted line frame in FIG. 4B) on the top surface 10a, in which the electrodes 11 are provided, so that the spacers 13 may surround the region 12.

As the spacers 23 arranged as in FIG. 4A and the spacers 13 arranged as in FIG. 4B, members may be used having fan-shaped sloping surfaces sloped at a given angle as the inside surfaces 23a and the outside surfaces 13a, respectively, as illustrated in FIG. 5.

Figure 7A:
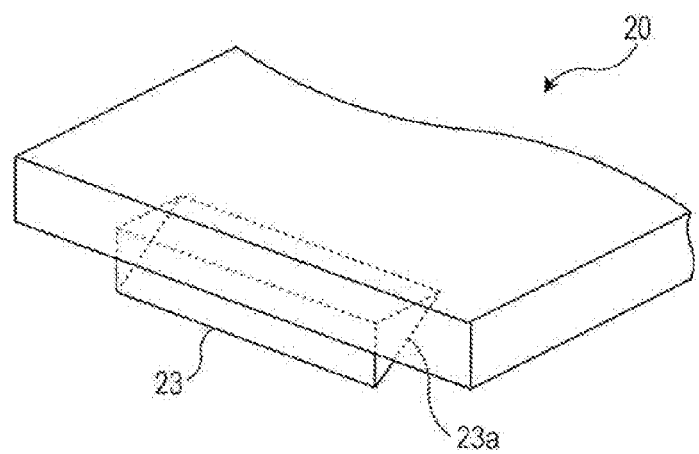
FIG. 7A and FIG. 7B illustrate a second example of configuration of the spacers.
Figure 7B:
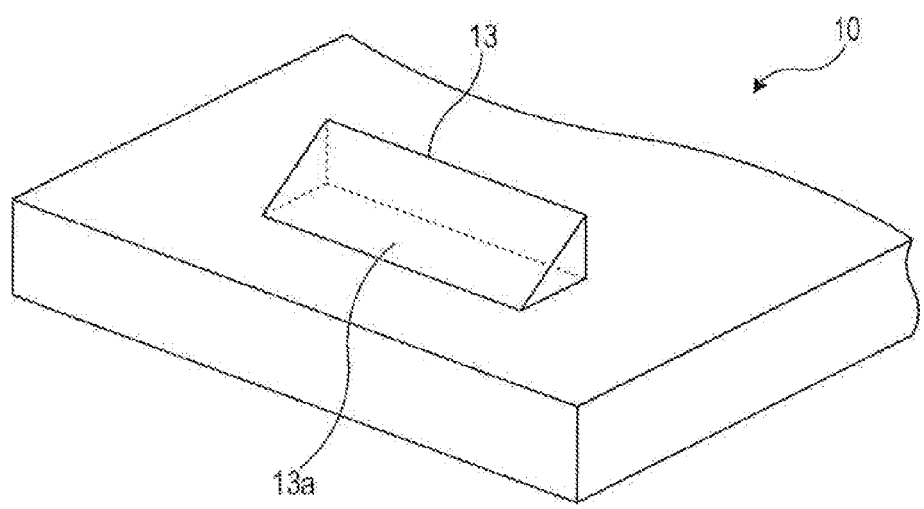

FIG. 6 illustrates a second example of arrangement of the spacers, and FIG. 7 illustrates a second example of configuration of the spacers. FIGS. 6A and 6B are schematic plan views of main parts of the electronic components as seen from the side of the surfaces on which the spacers are arranged. FIGS. 7A and 7B are schematic perspective views of main parts of the electronic components on which the spacers are arranged.

As illustrated in FIG. 6A, the spacers 23 on the electronic component 20 may be provided at positions corresponding to four sides of the region 22 (illustrated by a dotted line frame in FIG. 6A) on the bottom surface 20a, in which the electrodes 21 are provided, so that the spacers 23 may surround the region 22. As illustrated in FIG. 6B, similarly, the spacers 13 on the electronic component 10 that are provided corresponding to the spacers 23 may be provided at positions corresponding to four sides of the region 12 (illustrated by a dotted line frame in FIG. 6B) on the top surface 10a, in which the electrodes 11 are provided, so that the spacers 13 may surround the region 12.

As the spacers 23 arranged as in FIG. 6A and the spacers 13 arranged as in FIG. 6B, members may be used having rectangular sloping surfaces sloped at a given angle as the inside surfaces 23a and the outer surfaces 13a, respectively, as illustrated in FIG. 7.

The height of the spacers 23 on the electronic component 20 and the height of the spacers 13 on the electronic component 10 may be set based on a gap (height of solder joints) between the electronic component 20 and the electronic component 10 that is demanded for the electronic device to be manufactured.

For the spacers 23 and the spacers 13, an organic material, an inorganic material, or a metal material may be used, for instance. As the organic material, a resin material such as polyimide, polyetheretherketone, polytetrafluoroethylene, epoxy, silicone, polyamide, polyamide-imide, polyphenylene sulfide, or polyethersulfone may be used. As the inorganic material, aluminum nitride, silicon nitride, diamond-like carbon, or the like may be used. As the metal material, stainless steel, titanium, copper, alloy containing like materials, or the like may be used. The spacers 23 and the spacers 13 may be formed with the single use of any of such organic materials, inorganic materials, or metal materials or may be formed with the combined use of two or more from among such organic materials, inorganic materials, and metal materials. For instance, different materials may be used for the inside surfaces 23a and other parts of the spacers 23 and different materials may be used for the outside surfaces 13a and other parts of the spacers 13. The materials of the spacers 23 and the materials of the spacers 13 may be the same or different.

The spacers 23 and the spacers 13 may be fixed to the electronic component 20 and the electronic component 10, respectively, with the use of adhesive members such as a resin material, a paste material, and an adhesive sheet, for instance.

Herein, the spacers 23 and the spacers 13 that have the sloping surfaces sloped at the given angle as the inside surfaces 23a and the outside surfaces 13a are presented as the examples. The given angle, however, is not limited and the spacers 23 and the spacers 13 with the inside surfaces 23a and the outside surfaces 13a that are curved and sloped may be used. Alternatively, the spacers 23 and the spacers 13 that have the inside surfaces 23a and the outside surfaces 13a, either being sloped at a given angle, the other being curved and sloped, may be used.

The electronic component 20 provided with the spacers 23 as described above and the electronic component 10 provided with the spacers 13 as described above are joined with the use of the solder bumps, so that the electronic device is obtained.

Figure 8A:
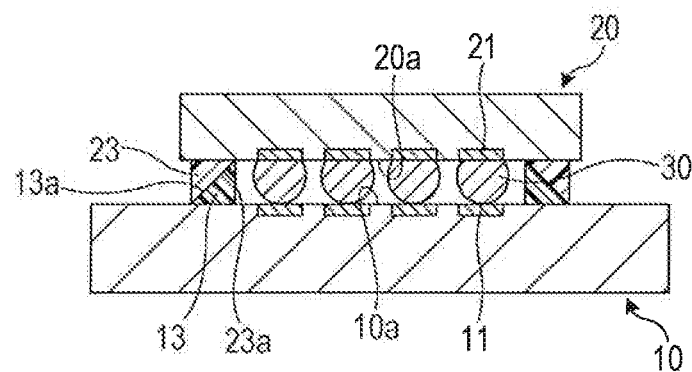
FIG. 8A, FIG. 8B, and FIG. 8C illustrate an example of a method of manufacturing the electronic device according to the first embodiment.
Figure 8B:
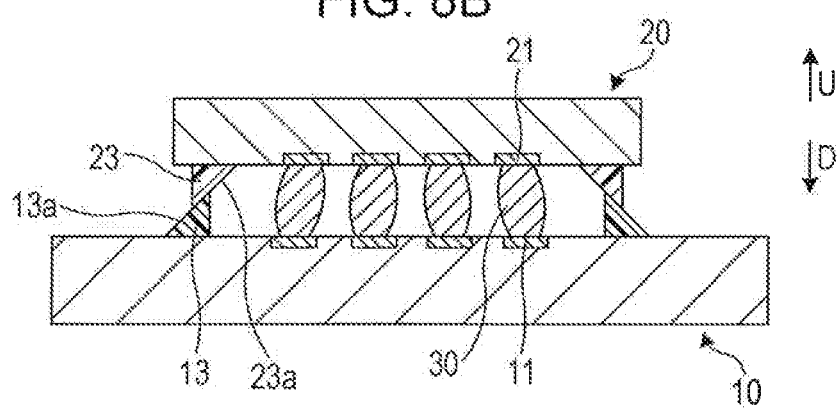
Figure 8C:
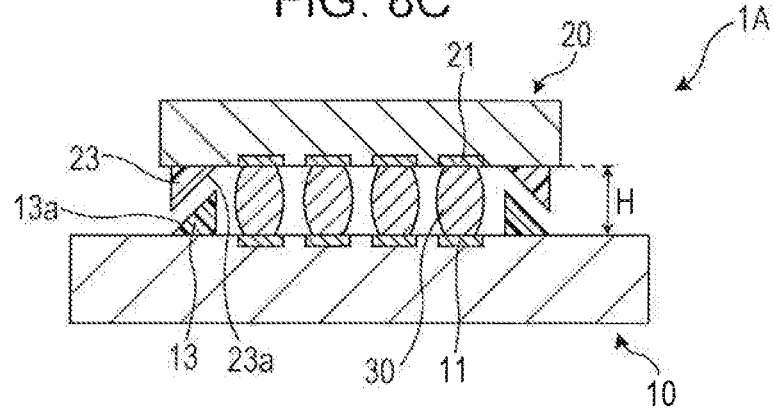

FIG. 8 illustrates an example of a method of manufacturing the electronic device according to the first embodiment. FIG. 8A is a schematic sectional view of a step of placing (tentatively mounting) the electronic components, FIG. 8B is a schematic sectional view of a step of heating (solder melting), and FIG. 8C is a schematic sectional view of a step of cooling (solder solidification).

Initially, the electronic component 20 and the electronic component 10 that are provided with the spacers 23 and the spacers 13 (FIG. 4 and FIG. 5 or FIG. 6 and FIG. 7), respectively, as described above and illustrated in FIG. 3A and FIG. 3B are prepared. As illustrated in FIG. 8A, the one electronic component 20 is placed on the other electronic component 10 with the solder bumps 30 interposed therebetween so that the bottom surface 20a and the top surface 10a on which the electrodes 21 and the electrodes 11 are provided face each other. The solder bumps 30 may be mounted on the electrodes 21 of the electronic component 20 in advance, for instance. Otherwise, the solder bumps 30 may be mounted on the electrodes 11 of the electronic component 10 in advance.

When the electronic component 20 is placed on the electronic component 10 with the solder bumps 30 interposed therebetween as illustrated in FIG. 8A, the outside surfaces 13a of the spacers 13 and the inside surfaces 23a of the spacers 23 that are at the positions corresponding to each other face each other. The outside surfaces 13a of the spacers 13 and the inside surfaces 23a of the spacers 23 come into contact with each other at this point of time, for instance. Though illustration is omitted herein, the outside surfaces 13a of the spacers 13 and the inside surfaces 23a of the spacers 23 may be in a noncontact state with each other at this point of time.

After the electronic component 20 is placed on the electronic component 10 with the solder bumps 30 interposed therebetween as illustrated in FIG. 8A, heating at a temperature higher than the melting point of the solder bumps 30 is carried out. As a result of the heating, the solder bumps 30 are melted and wetted on the electrodes 21 and the electrodes 11, and the electronic components 10 and 20 are thermally expanded, as illustrated in FIG. 8B.

Herein, the coefficient of thermal expansion of the electronic component 10 provided with the spacers 13 having the outside surfaces 13a facing outward is larger than the coefficient of thermal expansion of the electronic component 20 provided with the spacers 23 having the inside surfaces 23a facing inward, as described above. In the heating at the temperature higher than the melting point of the solder bumps 30, accordingly, the amount of thermal expansion (amount of lateral extension) of the electronic component 10 on the lower side is larger than the amount of thermal expansion of the electronic component 20 on the upper side. As a result, the electronic component 20 moves in a direction U such that the electronic component 20 moves away from the electronic component 10 while the inside surfaces 23a of the spacers 23 on the electronic component 20 slide on the outside surfaces 13a of the spacers 13 on the electronic component 10. That is, the electronic component 20 gradually moves upward (in the direction U) relative to the electronic component 10 while the spacers 23 on the electronic component 20 are guided by the spacers 13 on the electronic component 10 that undergoes relatively greater thermal expansion.

After the heating at the temperature higher than the melting point of the solder bumps 30, cooling is carried out to solidify the solder bumps 30 melted by the heating.

With the cooling, the temperature falls to the melting point of the solder bumps 30 or lower and the solder bumps 30 solidify in a state in which the electronic component 20 has moved up and hangs above the electronic component 10. Thus the electronic component 20 and the electronic component 10 are joined through the solder bumps 30 with a specified gap (height of joints) H, as illustrated in FIG. 8C. By the time the solder bumps 30 solidify, the electronic component 20 may move down in a direction D by an amount corresponding to weight of the electronic component 20, contraction in volume of the solder bumps 30, and the like.

In the cooling, the electronic components 10 and 20 undergo thermal contraction. Then the electronic component 10 undergoes greater thermal contraction than the electronic component 20 does. As the electronic component 10 undergoes greater thermal contraction than the electronic component 20 does, the electronic component 20 is separated from the spacers 13 on the electronic component 10, as illustrated in FIG. 8C, after being joined to the electronic component 10 through the solder bumps 30 with the specified gap H. Thus contact of the electronic component 20 with other members in parts excluding the solder bumps 30 is avoided because the electronic component 20 on the upper side is separated from the spacers 13 on the electronic component 10 on the lower side after the joining by the solder bumps 30.

Through the heating and cooling described above, the electronic device 1A is obtained in which the electronic component 20 and the electronic component 10 are joined through the solder bumps 30 with the specified gap H, as illustrated in FIG. 8C. In the electronic device 1A, the inside surfaces 23a of the spacers 23 on the electronic component 20 and the outside surfaces 13a of the spacers 13 on the electronic component 10 are not in contact, and thus occurrence of stresses, strain, and the like is restrained that might be caused in the electronic component 20, the solder joints, and the like in case of the contact.

In the first embodiment, the spacers 13 and 23 having the outside surfaces 13a and the inside surfaces 23a that come into contact with and slide along each other in the joining are thus provided on the electronic components 10 and 20, respectively, that are to be joined through the solder bumps 30. With the spacers 13 and 23 provided, the heating for melting the solder bumps 30 is carried out and the cooling for solidifying the solder bumps 30 is thereafter carried out, so that the electronic components 10 and 20 are joined through the solder bumps 30. According to this technique, the electronic components 10 and 20 may be soldered with the specified gap H with avoidance of the contact between the electronic component 20 (and the spacers 23) and the spacers 13, so that the electronic device 1A with high connection reliability may be provided.

Subsequently, a second embodiment will be described.

Herein, a wiring substrate and a semiconductor device are taken as examples of electronic components, and a method of joining the wiring substrate and the semiconductor device through solder bumps and thereby obtaining an electronic device is described.

Figure 9A:
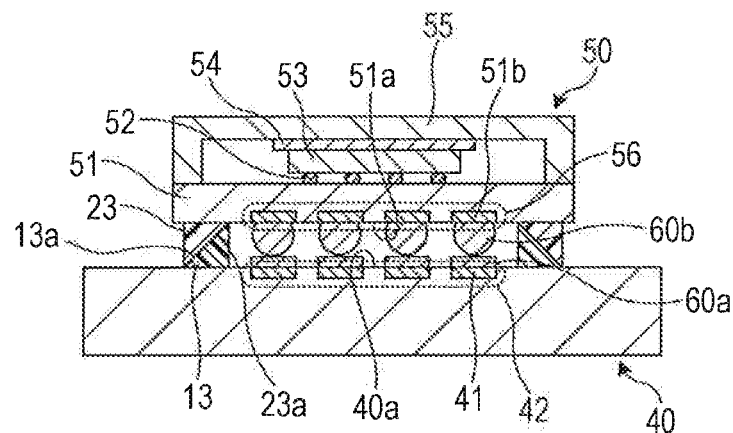
FIG. 9A, FIG. 9B, and FIG. 9C illustrate an example of a method of manufacturing an electronic device according to a second embodiment.
Figure 9B:
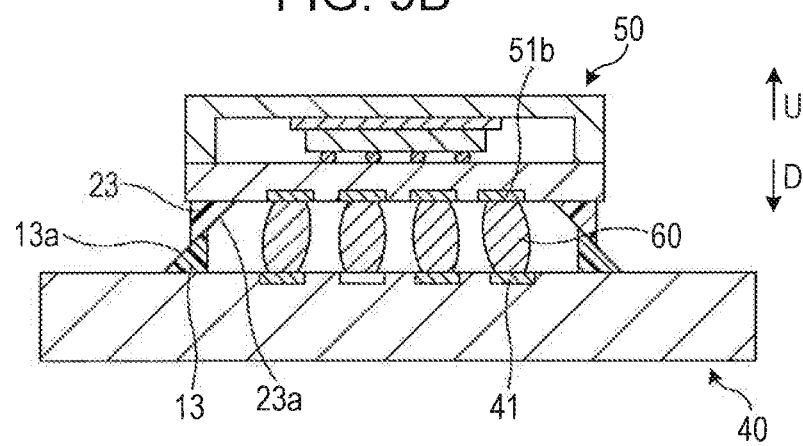
Figure 9C:
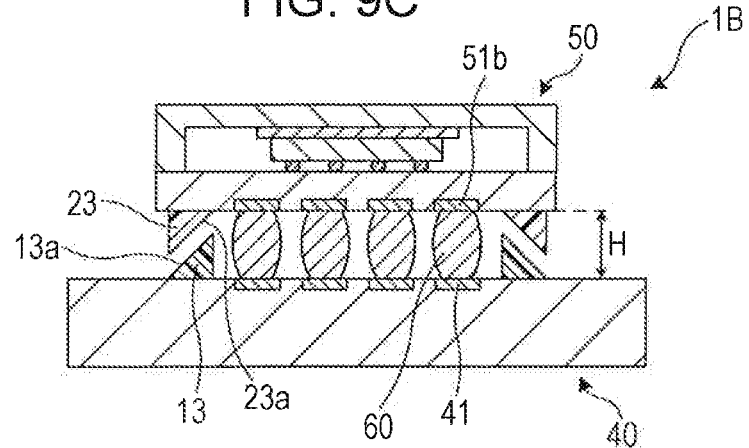

FIG. 9 illustrates an example of a method of manufacturing the electronic device according to the second embodiment. FIG. 9A is a schematic sectional view of a step of placing (tentatively mounting) the semiconductor device on the wiring substrate, FIG. 9B is a schematic sectional view of a step of heating (solder melting), and FIG. 9C is a schematic sectional view of a step of cooling (solder solidification).

In this example, initially, the wiring substrate 40 and the semiconductor device 50 that are illustrated in FIG. 9A are prepared. For instance, the semiconductor device 50 is a semiconductor package including a semiconductor chip such as a central processing unit (CPU), and the wiring substrate 40 is a mounted substrate such as a system board on which the semiconductor device 50, memory, and the like are mounted.

The wiring substrate 40 has a plurality of electrodes 41 provided on a top surface 40a thereof and the spacers 13 provided outside a region 42 (illustrated by a dotted line frame in FIG. 9A) in which the electrodes 41 are provided. The wiring substrate 40 further has wiring that is provided with a specified pattern and that is electrically connected to the electrodes 41 and conductive parts (not illustrated) such as vias that provide electrical connection between different wires in the wiring. In the wiring substrate 40, the electrodes 41 and the conductive parts (wiring, vias and the like) are provided on or in an insulating part for which an insulating material such as a resin material such as epoxy and a resin material containing glass fiber or the like is used.

The semiconductor device 50 includes a package substrate (wiring substrate) 51, a semiconductor chip 53 flip-chip bonded to the package substrate 51 with the use of solder bumps 52, and a lid 55 provided above the semiconductor chip 53 with a joint member 54 therebetween. For the joint member 54, a thermally conductive resin material, a paste material containing silver, solder or the like, a solder material, a thermal interface material (TIM), or the like may be used. For the lid 55, a thermally conductive metal material or the like may be used.

The package substrate 51 has electrodes 51b provided at positions corresponding to the electrodes 41 of the wiring substrate 40 on a bottom surface 51a thereof and the spacers 23 provided outside a region 56 (illustrated by a dotted line frame in FIG. 9A) in which the electrodes 51b are provided. The package substrate 51 further has wiring that is provided with a specified pattern and that is electrically connected to the electrodes 51b and conductive parts (not illustrated) such as vias that provide electrical connection between different wires in the wiring. In the package substrate 51, the electrodes 51b and the conductive parts (wiring, vias, and the like) are provided on or in an insulating part for which an insulating material such as a resin material such as epoxy and a resin material containing glass fiber or the like is used.

Herein, the semiconductor device 50 and the wiring substrate 40 differ in terms of coefficient of thermal expansion (degree of thermal expansion), and the coefficient of thermal expansion of the semiconductor device 50 (the package substrate 51, for instance) is smaller than the coefficient of thermal expansion of the wiring substrate 40 on which the semiconductor device 50 is to be mounted.

The spacers 23 on the semiconductor device 50 and the spacers 13 on the wiring substrate 40 are provided at positions corresponding to each other and may be arranged as described above and illustrated in FIGS. 4A and 4B or in FIGS. 6A and 6B, for instance. As the spacers 23 on the semiconductor device 50 and the spacers 13 on the wiring substrate 40, members having such shapes as illustrated in FIG. 5 or members having such shapes as illustrated in FIG. 7 may be used, for instance. The spacers 23 on the semiconductor device 50 and the spacers 13 on the wiring substrate 40, for which such an organic material, an inorganic material, a metal material, or the like as described above may be used, may be fixed to the semiconductor device 50 and the wiring substrate 40 by such an adhesion technique as described above or the like.

In the semiconductor device 50 with the comparatively small coefficient of thermal expansion, the spacers 23 having the inside surfaces 23a facing diagonally downward with respect to a bottom surface 51a of the package substrate 51 and inward in directions along a plane of the package substrate 51 are provided outside the region 56 on the bottom surface 51a in which the electrodes 51b are provided. In the wiring substrate 40 with the comparatively large coefficient of thermal expansion, the spacers 13 having the outside surfaces 13a facing diagonally upward with respect to the top surface 40a and outward in directions along a plane of the wiring substrate 40 are provided outside the region 42 on the top surface 40a in which the electrodes 41 are provided.

The wiring substrate 40 and the semiconductor device 50 that have such configurations as described above are prepared, and the semiconductor device 50 is placed on the wiring substrate 40 as illustrated in FIG. 9A. For this operation, in advance, solder pastes 60a are provided on the electrodes 41 of the wiring substrate 40 and solder balls 60b are provided on the electrodes 51b of the semiconductor device 50, for instance. Then the semiconductor device 50 is placed on the wiring substrate 40 so that the bottom surface 51a and the top surface 40a on which the electrodes 51b and the electrodes 41 are provided face each other, as illustrated in FIG. 9A. Thus the inside surfaces 23a of the spacers 23 and the outside surfaces 13a of the spacers 13 that are provided at the positions corresponding to each other face each other in a contact state or in a noncontact state of which illustration is omitted.

After the semiconductor device 50 is placed on the wiring substrate 40 with the solder pastes 60a and the solder balls 60b interposed therebetween as illustrated in FIG. 9A, heating at a temperature higher than the melting point of the solder pastes 60a and the solder balls 60b is carried out. As a result of the heating, the solder pastes 60a and the solder balls 60b are melted so that integrated solder bumps 60a are formed between the electrodes 41 and the electrodes 51b, as illustrated in FIG. 9B, and the wiring substrate 40 and the semiconductor device 50 are thermally expanded. In the thermal expansion, amount of thermal expansion (amount of lateral extension) of the wiring substrate 40 is made relatively large because the coefficient of thermal expansion of the wiring substrate 40 is larger than the coefficient of thermal expansion of the semiconductor device 50. As a result, the semiconductor device 50 gradually moves up in the direction U such that the semiconductor device 50 moves away from the wiring substrate 40 while the inside surfaces 23a of the spacers 23 on the semiconductor device 50 slide on the outside surfaces 13a of the spacers 13 on the wiring substrate 40.

After that, cooling is carried out. With the cooling, the temperature falls to the melting point of the solder bumps 60 or lower and the solder bumps 60 solidify in a state in which the semiconductor device 50 has moved up and hangs above the wiring substrate 40. Thus a state in which the semiconductor device 50 and the wiring substrate 40 are joined through the solder bumps 60 with the specified gap (height of joints) H is attained, as illustrated in FIG. 9C. By the time the solder bumps 60 solidify, the semiconductor device 50 may move down in the direction D by an amount corresponding to weight of the semiconductor device 50, contraction in volume of the solder bumps 60, and the like.

During the cooling, the wiring substrate 40 and the semiconductor device 50 undergo thermal contraction. Then the wiring substrate 40 undergoes greater thermal contraction than the semiconductor device 50 does. The semiconductor device 50 is thereby separated from the spacers 13 on the wiring substrate 40, as illustrated in FIG. 9C, after being joined to the wiring substrate 40 through the solder bumps 60 with the specified gap H. Thus contact of the semiconductor device 50 with other members in parts excluding the solder bumps 60 is avoided because the semiconductor device 50 on the upper side is separated from the spacers 13 on the wiring substrate 40 on the lower side after the joining by the solder bumps 60.

Through the heating and cooling described above, the electronic device 1B is obtained in which the semiconductor device 50 and the wiring substrate 40 are joined through the solder bumps 60 with the specified gap H, as illustrated in FIG. 9C. In the electronic device 1B, the inside surfaces 23a of the spacers 23 on the semiconductor device 50 and the outside surfaces 13a of the spacers 13 on the wiring substrate 40 are not in contact, and thus occurrence of stresses, strain, and the like is restrained that might be caused in the semiconductor device 50, the solder joints, and the like in case of the contact.

In the second embodiment, the spacers 13 and 23 having the outside surfaces 13a and the inside surfaces 23a that come into contact with and slide along each other in the joining are thus provided on the wiring substrate 40 and the semiconductor device 50, respectively, that are to be joined through the solder bumps 60. With the spacers 13 and 23 provided, the heating for melting the solder bumps 60 is carried out and the cooling for solidifying the solder bumps 60 is thereafter carried out, so that the wiring substrate 40 and the semiconductor device 50 are joined through the solder bumps 60. According to this technique, the wiring substrate 40 and the semiconductor device 50 may be soldered with the specified gap H with avoidance of the contact between the semiconductor device 50 (and the spacers 23) and the spacers 13, so that the electronic device 1B with high connection reliability may be provided.

The electronic device 1B may further be provided with a heat sink.

Figure 10:
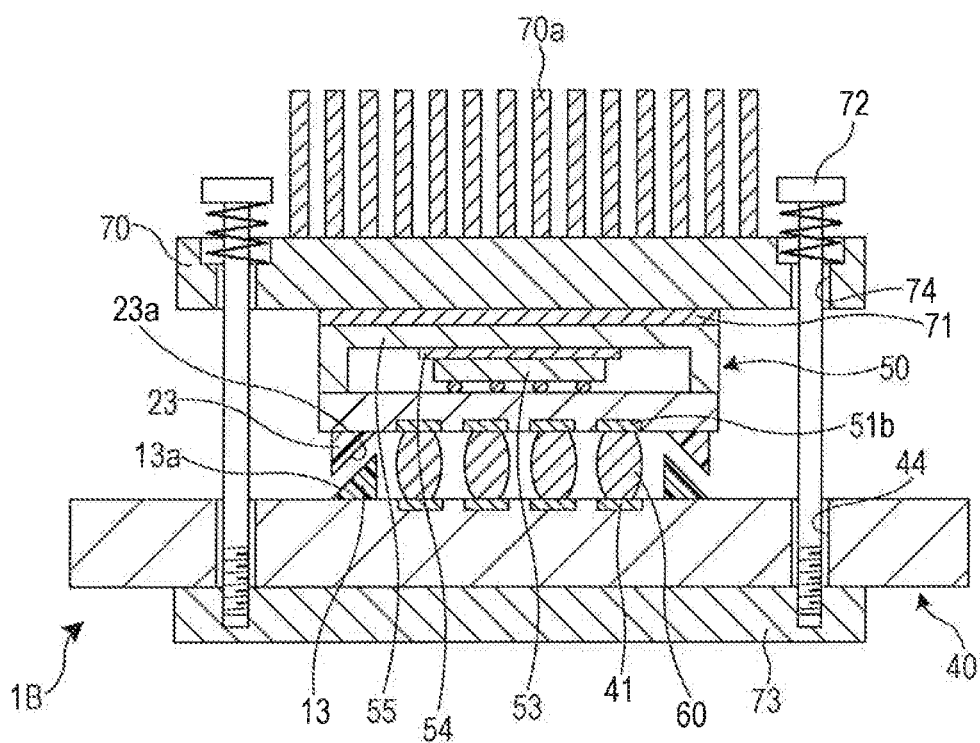
FIG. 10 illustrate another example of an electronic device according to the second embodiment.

FIG. 10 illustrates another example of an electronic device according to the second embodiment. FIG. 10 is a schematic sectional view of a main part of another example of the electronic device according to the second embodiment.

In the electronic device 1B, as illustrated in FIG. 10, the heat sink 70 having fins 70a may be connected thermally onto the lid 55 through a joint member 71 such as TIM. In this configuration, through holes 74 and through holes 44 are provided on the heat sink 70 and the wiring substrate 40, respectively. For fixation of the heat sink 70, screws 72 with springs and a base 73 having screw holes into which the screws 72 with springs may be screwed are used, for instance. The heat sink 70 is placed over the lid 55 with the joint member 71 therebetween. The screws 72 with springs are inserted into the through holes 74 of the heat sink 70 and into the through holes 44 of the wiring substrate 40 and are screwed into the screw holes of the base 73 provided on a bottom surface of the wiring substrate 40. Thus the heat sink 70 is fixed while being biased by the springs toward the base 73.

The fixation of the heat sink 70 is not limited to such a method with the use of the screws 72 with springs and the base 73. For instance, a base on which shafts having thread grooves on extremity parts thereof stand may be used and the wiring substrate 40 on which the semiconductor device 50 is mounted may initially be placed on the base so that the shafts on the base may be inserted into the through holes 44. Then the heat sink 70 may be placed on the lid 55 provided with the joint member 71 so that the shafts on the base may be inserted into the through holes 74, the springs may be attached onto portions of the shafts that extend from the heat sink 70, and fixation nuts may be screwed on the thread grooves on the extremity parts. Thus the heat sink 70 may be fixed while being biased by the springs toward the base.

With the heat sink 70 fixed onto the electronic device 1B, heat generated in the semiconductor chip 53 may be transferred through the joint member 54, the lid 55, and the joint member 71 to the heat sink 70 and may be dissipated from the heat sink 70. The fixation of the heat sink 70 makes it possible to increase an effect of heat dissipation (cooling) for the electronic device 1B.

Subsequently, a third embodiment will be described.

Figure 11A:
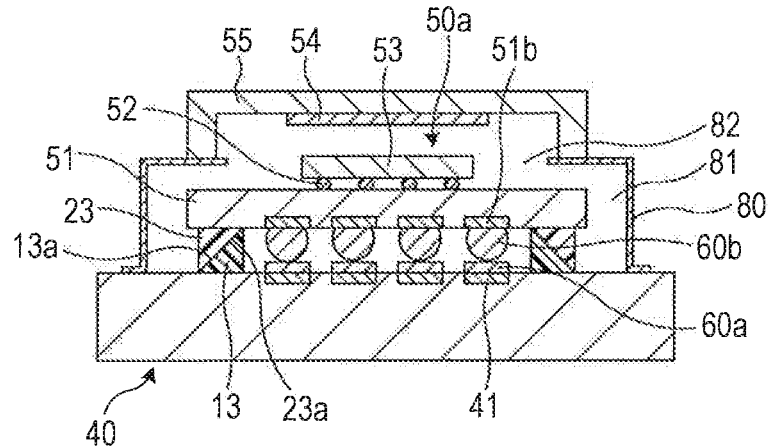
FIG. 11A, FIG. 11B, and FIG. 11C illustrate an example of a method of manufacturing an electronic device according to a third embodiment.
Figure 11B:
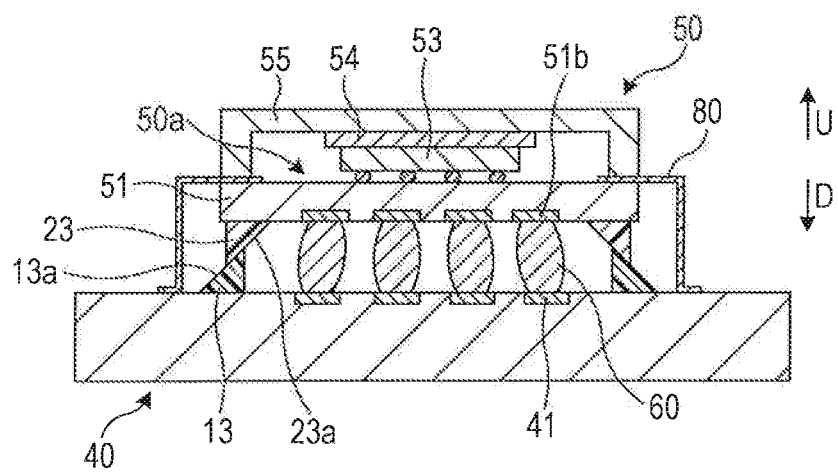
Figure 11C:
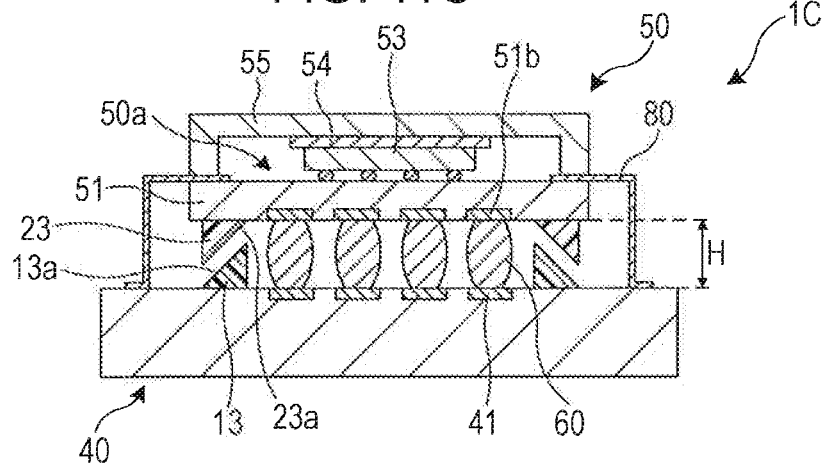

FIG. 11 illustrates an example of a method of manufacturing an electronic device according to the third embodiment. FIG. 11A is a schematic sectional view of a step of placing (tentatively mounting) the semiconductor device on the wiring substrate, FIG. 11B is a schematic sectional view of a step of heating (solder melting), and FIG. 11C is a schematic sectional view of a step of cooling (solder solidification).

As illustrated in FIG. 11A, initially, a semiconductor package 50a that is an electronic component in which the semiconductor chip 53 is mounted on the package substrate 51 and which is provided with the spacers 23 is placed on the wiring substrate 40 provided with the spacers 13. For this operation, in advance, the solder pastes 60a are provided on the electrodes 41 of the wiring substrate 40 and the solder balls 60b are provided on the electrodes 51b of the semiconductor device 50, for instance. Then the lid 55 provided with the joint member 54 is placed at a position that is above the semiconductor package 50a placed in such a manner and that is at a distance from the semiconductor chip 53. Fixed onto the lid 55 is a supporting member 80 having a space 81 that is capable of accommodating the semiconductor package 50a before and after thermal expansion thereof and an opening 82 that allows passage of the semiconductor chip 53 mounted on the package substrate 51. A structure having the space 81 that surrounds whole periphery of the semiconductor package 50a is not demanded for the supporting member 80.

The coefficient of thermal expansion of the package substrate 51 of the semiconductor package 50a is made smaller than the coefficient of thermal expansion of the wiring substrate 40. In the semiconductor package 50a, the semiconductor chip 53 is joined to the package substrate 51 with the use of the solder bumps 52 that has higher melting point than the solder pastes 60a and the solder balls 60b have.

For the joint member 54 provided on the lid 55, thermosetting resin or thermoplastic resin is used. The setting temperature of the thermosetting resin that is used is higher than the melting point of the solder pastes 60a and the solder balls 60b. The softening temperature of the thermoplastic resin that is used is higher than the melting point of the solder pastes 60a and the solder balls 60b. The thermosetting resin and the thermoplastic resin may contain filler such as silver and solder.

After the semiconductor package 50a and the lid 55 to which the supporting member 80 is fixed are placed on the wiring substrate 40 as described above, heating at a temperature higher than the melting point of the solder pastes 60a and the solder balls 60b is carried out. The heating is carried out at the temperature higher than the melting point of the solder pastes 60a and the solder balls 60b and lower than the melting point of the solder bumps 52. On condition that the thermosetting resin is used for the joint member 54, the temperature is lower than the setting temperature of the thermosetting resin. On condition that the thermoplastic resin is used for the joint member 54, the temperature is equal to or higher than the softening temperature of the thermoplastic resin.

As a result of the heating, the solder pastes 60a and the solder balls 60b are melted so that the solder bumps 60 are formed between the electrodes 41 and the electrodes 51b, as illustrated in FIG. 11B, and the wiring substrate 40 and the package substrate 51 of the semiconductor package 50a are thermally expanded. In that process, the amount of thermal expansion (amount of lateral extension) of the wiring substrate 40 is made relatively large because the coefficient of thermal expansion of the wiring substrate 40 is larger than the coefficient of thermal expansion of the package substrate 51. As a result, the semiconductor package 50a gradually moves up in the direction U such that the semiconductor package 50a moves away from the wiring substrate 40 while the inside surfaces 23a of the spacers 23 on the semiconductor package 50a slide on the outside surfaces 13a of the spacers 13 on the wiring substrate 40.

The semiconductor package 50a gradually moves up, and a top surface of the semiconductor chip 53 of the semiconductor package 50a is thereby brought into contact with the joint member 54 (the thermosetting resin in an unset state or the thermoplastic resin in a softened state) provided on the lid 55, as illustrated in FIG. 11B. On condition that the thermosetting resin is used for the joint member 54, the thermosetting resin is set by heating to the setting temperature or higher after the contact, and the semiconductor chip 53 and the lid 55 are thereby joined through the joint member 54. Thus the semiconductor device 50 is formed in which the lid 55 having the supporting member 80 fixed thereon is joined to the semiconductor package 50a through the joint member 54.

A height at which the lid 55 is placed (height of the space 81 in the supporting member 80) is set up in advance such that the top surface of the semiconductor chip 53 is brought into contact with the joint member 54 when the semiconductor package 50a is moved up by the heating.

After the heating described above, cooling is carried out. When the temperature becomes equal to or lower than the softening temperature of the thermoplastic resin before the solidification of the solder bumps 60 in the cooling on condition that the thermoplastic resin is used for the joint member 54, the thermoplastic resin is hardened so that the semiconductor chip 53 and the lid 55 are joined through the joint member 54. Thus the semiconductor device 50 in which the lid 55 having the supporting member 80 fixed thereon is joined to the semiconductor package 50a through the joint member 54 is formed, as illustrated in FIG. 11C.

When the temperature becomes equal to or lower than the melting point of the solder bumps 60 in a state in which the semiconductor package 50a has moved upward relative to the wiring substrate 40 and is joined to the lid 55 on the supporting member 80 through the joint member 54 (the thermosetting resin or the thermoplastic resin, in a hardened state), the solder bumps 60 are solidified. Thus a state in which the semiconductor device 50 and the wiring substrate 40 are joined through the solder bumps 60 with the specified gap (height of joints) H is attained, as illustrated in FIG. 11C. Lowering of the semiconductor package 50a in the direction U is restrained because the semiconductor package 50a is joined to the lid 55 through the joint member 54.

During the cooling, the wiring substrate 40 and the semiconductor device 50 undergo thermal contraction, and the wiring substrate 40 undergoes greater thermal contraction than the semiconductor device 50 does. As a result, a state in which the semiconductor device 50 is separated from the spacers 13 on the wiring substrate 40 is attained, as illustrated in FIG. 11C.

Through the heating and cooling described above, the electronic device 1C is obtained in which the semiconductor device 50 and the wiring substrate 40 are joined through the solder bumps 60 with the specified gap H, as illustrated in FIG. 11C. In the electronic device 1C, the inside surfaces 23a of the spacers 23 on the semiconductor device 50 and the outside surfaces 13a of the spacers 13 on the wiring substrate 40 are not in contact, and thus occurrence of stresses, strain, and the like is restrained that might be caused in the semiconductor device 50, the solder joints, and the like in case of the contact.

In the third embodiment, the spacers 13 and 23 having the outside surfaces 13a and the inside surfaces 23a that come into contact with and slide along each other in the joining are thus provided on the wiring substrate 40 and the package substrate 51, respectively, that are to be joined through the solder bumps 60. The package substrate 51 is moved upward relative to the wiring substrate 40 with the use of the spacers 13 and 23 and the thermal expansion of the wiring substrate 40, and the semiconductor chip 53 on the package substrate 51 is thereby joined to the lid 55 placed above in advance. By the subsequent cooling, the wiring substrate 40 and the semiconductor device 50 are joined through the solder bumps 60 with the specified gap H with the avoidance of the contact between the semiconductor device 50 (and the spacers 23) and the spacers 13. Thus the electronic device 1C with high connection reliability may be provided.

Though the example in which thermosetting resin or thermoplastic resin is used for the joint member 54 provided on the lid 55 has been presented in the above description, a solder material may be used for the joint member 54.

When a solder material is used for the joint member 54, melting point of the solder material is preferably higher than the melting point of the solder bumps 60 that join the package substrate 51 and the wiring substrate 40 and is preferably lower than the melting point of the solder bumps 52 that join the package substrate 51 and the semiconductor chip 53. The heating described for FIG. 11B is carried out at a temperature higher than the melting point of the joint member 54 and lower than the melting point of the solder bumps 52. By this operation, the package substrate 51 is moved up toward the lid 55 and is brought into contact with the joint member 54 in a state in which the solder bumps 60 and the joint member 54 are melted. In the cooling described for FIG. 11C, the semiconductor chip 53 on the package substrate 51 is initially joined to the lid 55 by the solidification of the joint member 54, and the package substrate 51 (semiconductor device 50) is then joined to the wiring substrate 40 by the solidification of the solder bumps 60 with progress of the cooling. As the wiring substrate 40 undergoes greater thermal contraction than the semiconductor device 50 does, the state in which the semiconductor device 50 is separated from the spacers 13 on the wiring substrate 40 is attained. Thus the electronic device with high connection reliability may be provided in the same manner as described above, on condition that the solder material is used for the joint member 54.

Subsequently, a fourth embodiment will be described.

In the manufacture of the electronic device 1C in the third embodiment, the lid 55 is supported by the supporting member 80 and is placed above the semiconductor chip 53. It is, however, not demanded that the lid 55 placed above the semiconductor chip 53 is supported by the supporting member 80. Herein, an example of a method of manufacturing an electronic device without the use of the supporting member 80 will be described as the fourth embodiment.

Figure 12A:
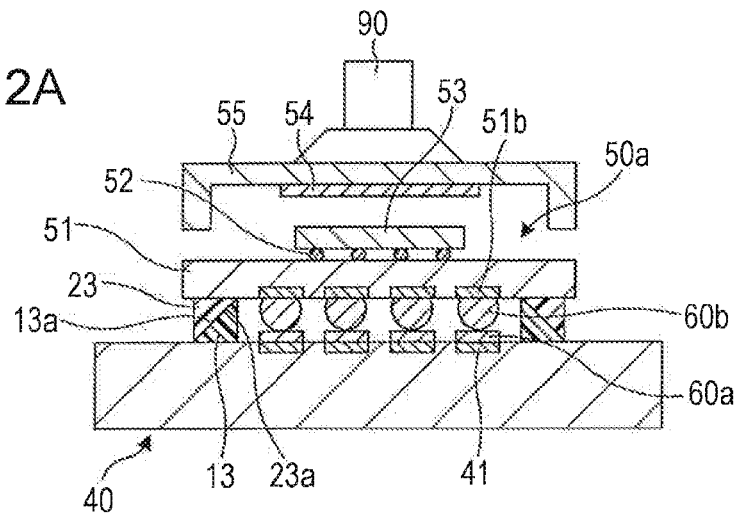
FIG. 12A, FIG. 12B, and FIG. 12C illustrate an example of a method of manufacturing an electronic device according to a fourth embodiment.
Figure 12B:
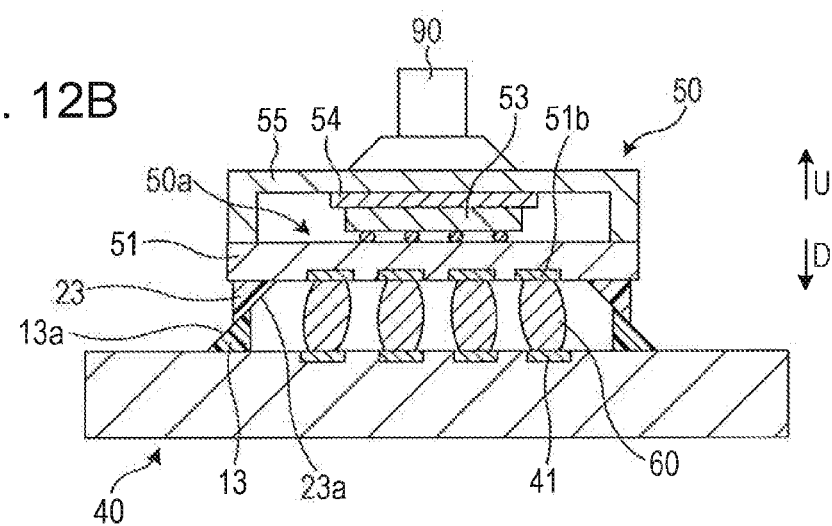
Figure 12C:
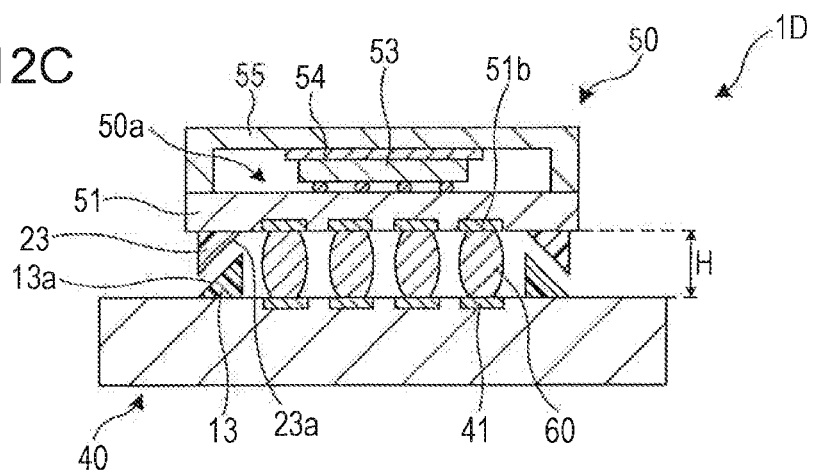

FIG. 12 illustrates the example of the method of manufacturing the electronic device according to the fourth embodiment. FIG. 12A is a schematic sectional view of a step of placing (tentatively mounting) the semiconductor device on the wiring substrate, FIG. 12B is a schematic sectional view of a step of heating (solder melting), and FIG. 12C is a schematic sectional view of a step of cooling (solder solidification).

As illustrated in FIG. 12A, initially, the semiconductor package 50a that is an electronic component is placed on the wiring substrate 40 with the solder pastes 60a and the solder balls 60b interposed therebetween, and the lid 55 provided with the joint member 54 is held above the semiconductor chip 53 with the use of a holding device 90. As the holding device 90, a device capable of holding the lid 55 by a suction technique, a clip technique, or the like may be used, for instance. Herein, the holding device 90 that holds the lid 55 by the suction technique is illustrated as an example.

After that, heating at a specified temperature is carried out in the same manner as described above for the third embodiment. As illustrated in FIG. 12B, in this process, the solder bumps 60 are formed between the electrodes 41 and the electrodes 51b, and the semiconductor package 50a gradually moves up in the direction U such that the semiconductor package 50a moves away from the wiring substrate 40. Consequently, the top surface of the semiconductor chip 53 of the semiconductor package 50a is brought into contact with the joint member 54 provided on the lid 55. On condition that such thermosetting resin as described for the third embodiment is used for the joint member 54, the thermosetting resin is set by heating to the setting temperature or higher after the contact, and the semiconductor device 50 in which the lid 55 is joined to the semiconductor package 50a through the joint member 54 is thereby formed. Holding of the lid 55 by the holding device 90 may be released after the lid 55 is joined through the joint member 54.

After that, cooling is carried out. On condition that such thermoplastic resin as described above for the third embodiment is used for the joint member 54, the thermoplastic resin is hardened when the temperature becomes equal to or lower than the softening temperature of the thermoplastic resin before the solidification of the solder bumps 60 in the cooling. Thus the semiconductor device 50 in which the lid 55 is joined to the semiconductor package 50a through the joint member 54 is formed as illustrated in FIG. 12C. The holding of the lid 55 by the holding device 90 may be released after the lid 55 is joined through the joint member 54.

When the temperature becomes equal to or lower than the melting point of the solder bumps 60 in the state in which the semiconductor package 50a has moved upward relative to the wiring substrate 40 and is joined to the lid 55 through the joint member 54 (thermosetting resin or thermoplastic resin, in a hardened state), the solder bumps 60 are solidified. Thus the state in which the semiconductor device 50 and the wiring substrate 40 are joined through the solder bumps 60 with the specified gap (height of joints) H is attained, as illustrated in FIG. 12C. During the cooling, additionally, the wiring substrate 40 and the semiconductor device 50 undergo thermal contraction, and the wiring substrate 40 undergoes greater thermal contraction than the semiconductor device 50 does. Thus the state in which the semiconductor device 50 is separated from the spacers 13 on the wiring substrate 40 is attained, as illustrated in FIG. 12C.

As a result, the electronic device 1D in which the semiconductor device 50 and the wiring substrate 40 are joined through the solder bumps 60 with the specified gap H is obtained, as illustrated in FIG. 12C. In the electronic device 1D, the inside surfaces 23a of the spacers 23 and the outside surfaces 13a of the spacers 13 are not in contact, and thus occurrence of stresses, strain, and the like is restrained that might be caused in the semiconductor device 50, the solder joints, and the like in case of the contact.

According to such a technique, the electronic device 1D with high connection reliability in which the wiring substrate 40 and the semiconductor device 50 are soldered with the specified gap H may be provided as is the case with the third embodiment. In addition, the electronic device 1D may be provided while the supporting member 80 as described for the third embodiment may be omitted.

In this technique described for the fourth embodiment, solder material with a specified melting point may be used for the joint member 54 as described above for the third embodiment.

Subsequently, a fifth embodiment will be described.

Figure 13:
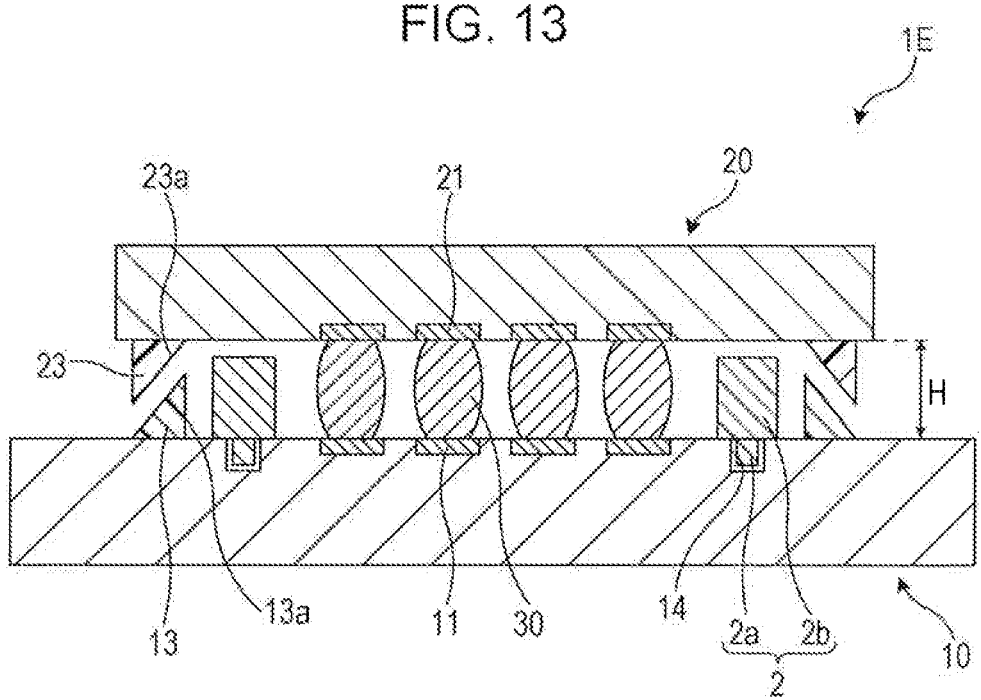
FIG. 13 illustrates an example of an electronic device according to a fifth embodiment.

FIG. 13 illustrates an example of an electronic device according to the fifth embodiment. FIG. 13 is a schematic sectional view of a main part of the example of the electronic device.

The electronic device 1E illustrated in FIG. 13 is different from the electronic device 1A (FIG. 8C) according to the first embodiment in that stand-off members 2 are provided separately from the spacers 13 and 23 between the electronic components 10 and 20. For instance, holes 14 are provided on the electronic component 10, and the stand-off members 2 are used that have insert parts 2a to be inserted into the holes 14 and stand-off parts 2b with a height set based on the gap H between the electronic components 10 and 20 which is demanded for the electronic device 1E to be produced.

By the use of the stand-off members 2, a decrease in the height of joints given by the solder bumps 30 to below the height of the stand-off parts 2b may be avoided and the specified gap may be ensured between the electronic components 10 and 20.

A single member corresponding to the stand-off parts 2b may be used as a stand-off member provided between the electronic components 10 and 20.

Such stand-off members as described for the fifth embodiment may be provided between the wiring substrate 40 and the semiconductor device 50 (package substrate 51) in the electronic devices 1B, 1C, and 1D according to the second, third, and fourth embodiments.

Subsequently, a sixth embodiment will be described.

Figure 14A:
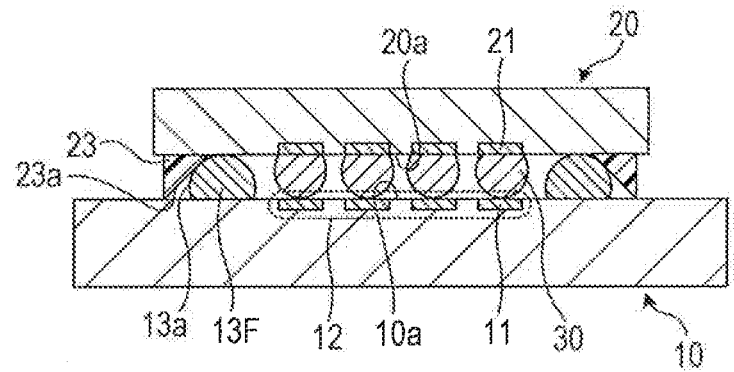
FIG. 14A, FIG. 14B, and FIG. 14C illustrate an example of a method of manufacturing an electronic device according to a sixth embodiment.
Figure 14B:
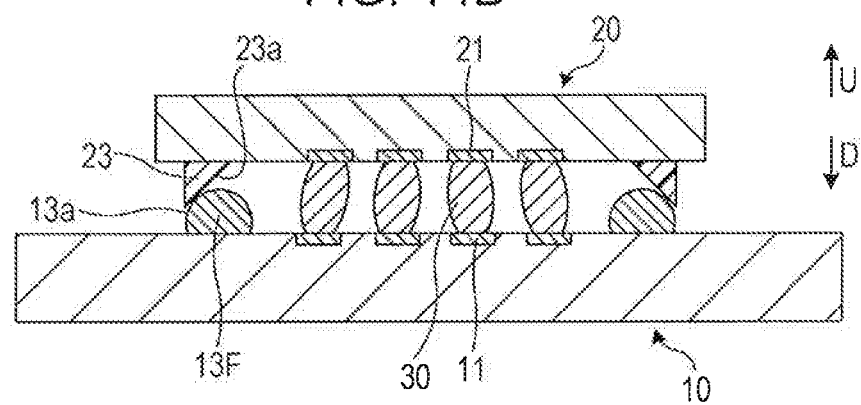
Figure 14C:
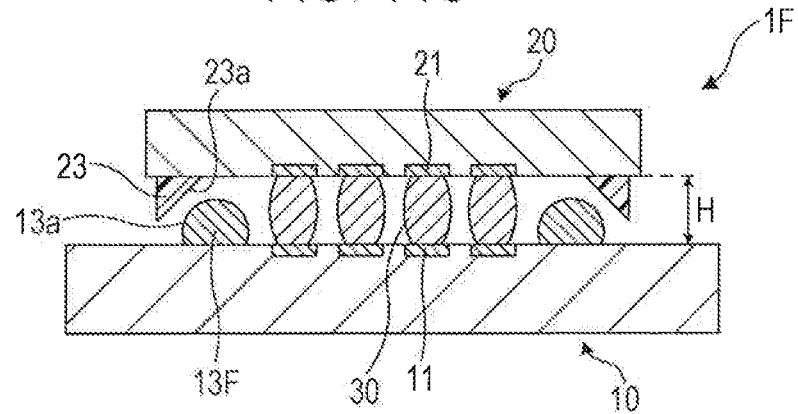

FIG. 14 illustrates an example of a method of manufacturing an electronic device according to the sixth embodiment. FIG. 14A is a schematic sectional view of a step of placing (tentatively mounting) the electronic components, FIG. 14B is a schematic sectional view of a step of heating (solder melting), and FIG. 14C is a schematic sectional view of a step of cooling (solder solidification).

This example is different from the first embodiment in that the electronic component 10 is used that is provided with spacers 13F having curved outside surfaces 13a outside the region 12 on the top surface 10a on which the electrodes 11 are provided, as illustrated in FIG. 14A. For instance, the electronic component 10 is provided with the hemispherical spacers 13F having the outside surfaces 13a facing diagonally upward with respect to the top surface 10a and outward in directions along the plane of the electronic component 10.

As illustrated in FIG. 14A, the electronic component 20 is placed on the electronic component 10, provided with the spacers 13F having the curved outside surfaces 13a, with the solder bumps 30 interposed therebetween. With the heating at the specified temperature, the relatively great thermal expansion of the electronic component 10 makes the electronic component 20 move up in the direction U so that the inside surfaces 23a of the spacers 23 on the electronic component 20 slide on the curved outside surfaces 13a of the spacers 13F on the electronic component 10, as illustrated in FIG. 14B. Then the inside surfaces 23a of the spacers 23 are in point contact with the outside surfaces 13a of the spacers 13F. The electronic component 20 smoothly moves up in the direction U, even if there is deformation such as warping in the electronic component 10 or the electronic component 20, because the spacers 13F have the curved outside surfaces 13a and because the inside surfaces 23a of the spacers 23 are in point contact with the outside surfaces 13a. With the subsequent cooling, the solder bumps 30 solidify and the electronic component 20 is separated from the spacers 13F by the relatively great thermal contraction of the electronic component 10 compared with the electronic component 20. As a result, the electronic device 1F illustrated in FIG. 14C is obtained.

With the use of the spacers 13F having the curved outside surfaces 13a, the electronic device 1F with high connection reliability in which the electronic components 10 and 20 are soldered with the specified gap H may be provided.

Figure 15A:
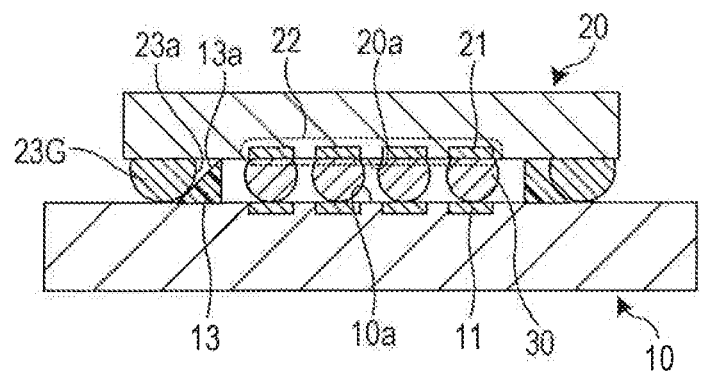
FIG. 15A, FIG. 15B, and FIG. 15C illustrate another example of a method of manufacturing an electronic device according to the sixth embodiment.
Figure 15B:
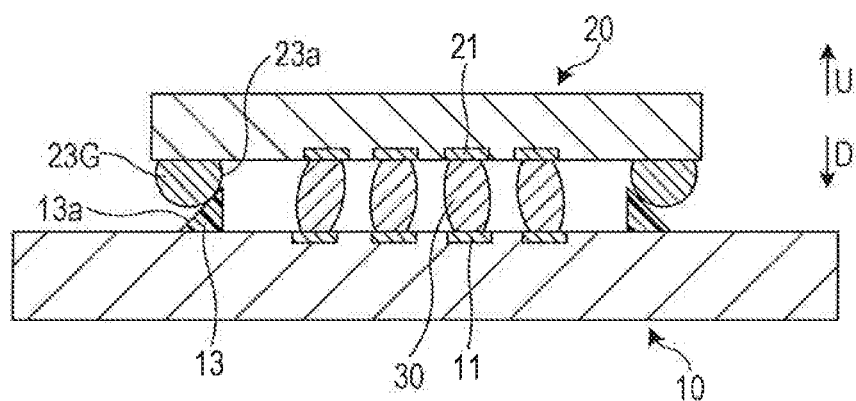
Figure 15C:
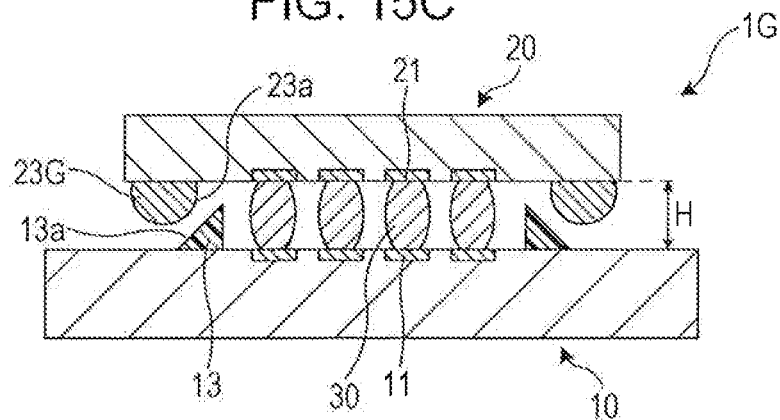

FIG. 15 illustrates another example of a method of manufacturing the electronic device according to the sixth embodiment. FIG. 15A is a schematic sectional view of a step of placing (tentatively mounting) the electronic components, FIG. 15B is a schematic sectional view of a step of heating (solder melting), and FIG. 15C is a schematic sectional view of a step of cooling (solder solidification).

This example is different from the first embodiment in that the electronic component 20 is used that is provided with spacers 23G having curved inside surfaces 23a outside the region 22 on the bottom surface 20a on which the electrodes 21 are provided, as illustrated in FIG. 15A. For instance, the electronic component 20 is provided with the hemispherical spacers 23G having the inside surfaces 23a facing diagonally downward with respect to the bottom surface 20a and inward in directions along the plane of the electronic component 20.

As illustrated in FIG. 15A, the electronic component 20 provided with the spacers 23G having the curved inside surfaces 23a is placed on the electronic component 10, provided with the spacers 13 having the outside surfaces 13a, with the solder bumps 30 interposed therebetween. With the heating at the specified temperature, the relatively great thermal expansion of the electronic component 10 makes the electronic component 20 move up in the direction U so that the curved inside surfaces 23a of the spacers 23G on the electronic component 20 slide on the outside surfaces 13a of the spacers 13 on the electronic component 10, as illustrated in FIG. 15B. Then the outside surfaces 13a of the spacers 13 are in point contact with the inside surfaces 23a of the spacers 23G. The electronic component 20 smoothly moves up in the direction U, even if there is deformation such as warping in the electronic component 10 or the electronic component 20, because the spacers 23G have the curved inside surfaces 23a and because the outside surfaces 13a of the spacers 13 are in point contact with the inside surfaces 23a. With the subsequent cooling, the solder bumps 30 solidify and the electronic component 20 is separated from the spacers 13 by the relatively great thermal contraction of the electronic component 10 compared with the electronic component 20. As a result, the electronic device 1G illustrated in FIG. 15C is obtained.

With the use of the spacers 23G having the curved inside surfaces 23a, the electronic device 1G with high connection reliability in which the electronic components 10 and 20 are soldered with the specified gap H may be provided.

The spacers 13F and 23 or the spacers 13 and 23G described for the sixth embodiment may be employed for the wiring substrate 40 and the semiconductor device 50 (package substrate 51) in the electronic devices 1B, 1C, and 1D according to the second, third, and fourth embodiments.

In the electronic devices 1F and 1G according to the sixth embodiment, such stand-off members as described for the fifth embodiment may be provided between the electronic components 10 and 20.

In the above description, the examples in which the plurality of spacers are provided on the electronic components have been presented as illustrated in FIGS. 4A and 4B or FIGS. 6A and 6B, for instance. Otherwise, a single frame-like member that surrounds the region on each of the electronic components in which the electrodes are provided and that is provided with sloping surfaces and/or curved surfaces facing in specified directions (outward or inward) may be used as a spacer, for instance.

Hereinbelow, examples and a comparative example will be described.

Example 1

In an example 1, the electronic device 1B is obtained with the use of the method (FIGS. 9A through 9C) according to the second embodiment. In the example 1, the semiconductor device 50 provided with the spacers 23 having the fan-shaped inside surfaces 23a as in FIG. 5 at such positions as in FIG. 4A and the wiring substrate 40 provided with the spacers 13 having the fan-shaped outside surfaces 13a as in FIG. 5 at such positions as in FIG. 4B are used and soldered.

Initially, the solder pastes 60a containing Sn—Ag—Cu-based solder (melting point: 217° C.) are applied by printing method onto the electrodes 41 of the wiring substrate 40. The solder balls 60b of Sn—Ag—Cu-based solder (melting point: 217° C.) with a diameter of 600 μm are mounted on the electrodes 51b of the package substrate 51 of the semiconductor device 50. The semiconductor device 50 is placed on the wiring substrate 40 with the use of a mounter (FIG. 9A) and is reflowed in nitrogen ($N_2$) atmosphere (FIG. 9B, FIG. 9C). In the reflowing, preheating is performed at a temperature of 180° C. on condition of a heating-up period between 90 and 120 seconds, main heating is performed at a temperature of 220° C. on condition of a heating-up period of 60 seconds, a holding period at peak temperature of 235° C. is 10 seconds, and a cooling rate is between 0.3° C./sec and 0.8° C./sec, for instance.

In the reflowing, the solder pastes 60a and the solder balls 60b that are Sn—Ag—Cu-based are melted at a temperature equal to or higher than the temperature for the main heating, and the solder bumps 60 are thereby formed. Herein, the coefficient of thermal expansion of the wiring substrate 40 is 30 ppm/° C. and the coefficient of thermal expansion of the package substrate 51 is 25 ppm/° C. In the heating by which the solder pastes 60a and the solder balls 60b are melted, the relatively great thermal expansion of the wiring substrate 40 makes the semiconductor device 50 gradually move up in the direction U so that the inside surfaces 23a of the spacers 23 on the semiconductor device 50 slide on the outside surfaces 13a of the spacers 13 on the wiring substrate 40.

With advance to a stage for the cooling, the semiconductor device 50 lowers by about 5 μm and the solder bumps 60 solidify at the melting point of 217° C., so that the semiconductor device 50 and the wiring substrate 40 are joined through the solder bumps 60 with the specified gap H. In the cooling, additionally, the wiring substrate 40 undergoes greater thermal contraction than the semiconductor device 50 does, so that the semiconductor device 50 is separated from the spacers 13. Thus the electronic device 1B in which the semiconductor device 50 is separated from the spacers 13 and is soldered to the wiring substrate 40 with the specified gap H is obtained.

A continuity test on the solder joints of the electronic device 1B obtained in the example 1 was conducted, and it was consequently verified that there was continuity in all the solder joints. A temperature cycling test in which rising and falling in temperature between −55° C. and 125° C. were repeated for 1000 cycles was conducted, and satisfactory results in which rate of change in resistance of the solder joints was 5% or lower were consequently exhibited. Cross-sectional scanning electron microscope (SEM) observation on the solder joints was conducted with the use of SEM before the temperature cycling test, and it was consequently verified that positional shifts of the solder joints (positional shifts between the electrodes 41 and the electrodes 51b) were reduced. Cross-sectional SEM observation on the solder joints was similarly conducted after the temperature cycling test, and it was consequently verified that there were no cracks in inside of the solder joints and parts for connection to the electrodes 41 and the electrodes 51b.

Example 2

In an example 2, the electronic device 1B is obtained with the use of the method (FIGS. 9A through 9C) according to the second embodiment, as is the case with the example 1. In the example 2, the semiconductor device 50 provided with the spacers 23 having the rectangular inside surfaces 23a as in FIG. 7 at such positions as in FIG. 6A and the wiring substrate 40 provided with the spacers 13 having the rectangular outside surfaces 13a as in FIG. 7 at such positions as in FIG. 6B are used and soldered. The material of the solder pastes 60a and the solder balls 60b is Sn—Ag—Cu-based solder as is the case with the example 1.

A continuity test on the solder joints of the electronic device 1B obtained in the example 2 was conducted, and it was consequently verified that there was continuity in all the solder joints. A temperature cycling test was conducted, and satisfactory results in which the rate of change in the resistance of the solder joints was 5% or lower were consequently exhibited. Cross-sectional SEM observation on the solder joints was conducted before the temperature cycling test, and it was consequently verified that the positional shifts of the solder joints (positional shifts between the electrodes 41 and the electrodes 51b) were reduced. Cross-sectional SEM observation on the solder joints was conducted after the temperature cycling test, and it was consequently verified that there were no cracks in the inside of the solder joints and the parts for connection to the electrodes 41 and the electrodes 51b.

Example 3

In an example 3, the electronic device 1B is obtained with substitution of Sn—Bi-based solder for Sn—Ag—Cu-based solder that is the material of the solder pastes 60a and the solder balls 60b in the example 1.

A continuity test on the solder joints of the electronic device 1B obtained in the example 3 was conducted, and it was consequently verified that there was continuity in all the solder joints. A temperature cycling test was conducted, and satisfactory results in which the rate of change in the resistance of the solder joints was 5% or lower were consequently exhibited. By cross-sectional SEM observation on the solder joints conducted before the temperature cycling test, it was verified that the positional shifts of the solder joints (positional shifts between the electrodes 41 and the electrodes 51b) were reduced. By cross-sectional SEM observation on the solder joints conducted after the temperature cycling test, it was verified that there were no cracks in the inside of the solder joints and the parts for connection to the electrodes 41 and the electrodes 51b.

Example 4

In an example 4, the electronic device 1C is obtained with the use of the method (FIGS. 11A through 11C) according to the third embodiment. In the example 4, the semiconductor device 50 provided with the spacers 23 having the fan-shaped inside surfaces 23a as in FIG. 5 at such positions as in FIG. 4A and the wiring substrate 40 provided with the spacers 13 having the fan-shaped outside surfaces 13a as in FIG. 5 at such positions as in FIG. 4B are used and soldered. The material of the solder pastes 60a and the solder balls 60b is Sn—Ag—Cu-based solder as is the case with the example 1. For the joint member 54 on the lid 55, thermosetting resin having setting temperature of 260° C. is used.

A continuity test on the solder joints of the electronic device 1C obtained in the example 4 was conducted, and it was consequently verified that there was continuity in all the solder joints. A temperature cycling test was conducted, and satisfactory results in which the rate of change in the resistance of the solder joints was 5% or lower were consequently exhibited. By cross-sectional SEM observation on the solder joints conducted before the temperature cycling test, it was verified that the positional shifts of the solder joints (positional shifts between the electrodes 41 and the electrodes 51*b*) were reduced. By cross-sectional SEM observation on the solder joints conducted after the temperature cycling test, it was verified that there were no cracks in the inside of the solder joints and the parts for connection to the electrodes 41 and the electrodes 51*b*.

Example 5

In an example 5, the electronic device 1C is obtained with substitution of thermoplastic resin for thermosetting resin that is the material of the joint member 54 in the example 3.

A continuity test on the solder joints of the electronic device 1C obtained in the example 5 was conducted, and it was consequently verified that there was continuity in all the solder joints. A temperature cycling test was conducted, and satisfactory results in which the rate of change in the resistance of the solder joints was 5% or lower were consequently exhibited. By cross-sectional SEM observation on the solder joints conducted before the temperature cycling test, it was verified that the positional shifts of the solder joints (positional shifts between the electrodes 41 and the electrodes 51*b*) were reduced. By cross-sectional SEM observation on the solder joints conducted after the temperature cycling test, it was verified that there were no cracks in the inside of the solder joints and the parts for connection to the electrodes 41 and the electrodes 51*b*.

Comparative Example

The stand-off members 140 (FIG. 2) that have the stand-off parts 142 with the height corresponding to the gap H provided between the semiconductor device 50 and the wiring substrate 40 are used in place of the spacers 23 and the spacers 13 of the example 1, and the semiconductor device 50 and the wiring substrate 40 are soldered to obtain an electronic device.

A continuity test on solder joints of the electronic device obtained in the comparative example was conducted, and it was consequently verified that there were joints without continuity. A temperature cycling test was conducted, and resultant rate of change in resistance of the solder joints was 50% or higher. By cross-sectional SEM observation on the solder joints conducted before the temperature cycling test, it was verified that positional shifts of the solder joints (positional shifts between the electrodes 41 and the electrodes 51*b*) were brought about. By cross-sectional SEM observation on the solder joints conducted after the temperature cycling test, it was verified that cracks were made in inside of the solder joints and parts for connection to the electrodes 41 and the electrodes 51*b*.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
a first electronic component;
first members that are provided on a first surface of the first electronic component so as to surround the first electronic component and that include outside surfaces configured to face diagonally upward with respect to the first surface;
a second electronic component provided above the first surface;
second members that are provided corresponding to the first members on a second surface of the second electronic component which faces the first surface so as to surround the second electronic component and that include inside surfaces configured to face diagonally downward with respect to the second surface and configured to face the outside surfaces; and
solder that is provided between the first surface and the second surface and that electrically connects the first electronic component and the second electronic component.

2. The electronic device according to claim 1, wherein a coefficient of thermal expansion of the first electronic component is larger than a coefficient of thermal expansion of the second electronic component.

3. The electronic device according to claim 1, wherein the outside surfaces and the inside surfaces are sloping surfaces.

4. The electronic device according to claim 1, wherein one of the outside surfaces and the inside surfaces are sloping surfaces, and wherein the other of the outside surfaces and the inside surfaces are curved surfaces.

5. The electronic device according to claim 1, wherein the first members and the second members are provided so as to surround the solder.

6. The electronic device according to claim 1, wherein the outside surfaces and the inside surfaces are spaced apart from each other.

7. The electronic device according to claim 1, further comprising:
spacers provided between the first surface and the second surface.

8. A method of manufacturing an electronic device, the method comprising:
preparing a first electronic component which has a first surface and in which first members that include outside surfaces configured to face diagonally upward with respect to the first surface are provided on the first surface so as to surround the first electronic component;
preparing a second electronic component which has a second surface and in which second members that include inside surfaces configured to face diagonally upward with respect to the second surface are provided on the second surface corresponding to the first members so as to surround the second electronic component;
placing the second electronic component above the first electronic component so that the first surface and the second surface face each other with solder therebetween and so that the outside surfaces and the inside surfaces face each other;
melting the solder; and
solidifying the melted solder.

9. The method of manufacturing the electronic device according to claim 8, wherein a coefficient of thermal expansion of the first electronic component is larger than a coefficient of thermal expansion of the second electronic component.

10. The method of manufacturing the electronic device according to claim 8,
wherein the melting the solder includes bringing the inside surfaces into contact with the outside surfaces and the second electronic component with the second members guided by the first members moving in such a direction that the second electronic component moves away from the first electronic component, as a result of an effect of thermal expansion of the second electronic component.

11. The method of manufacturing the electronic device according to claim 10,
wherein the solidifying the solder includes the inside surfaces and the outside surfaces, brought into contact by the melting the solder, becoming spaced as a result of an effect of thermal contraction of the second electronic component.

12. The method of manufacturing the electronic device according to claim 10, further comprising:
placing a third member on which a joint member is provided at a site facing the second electronic component, above the second electronic component after the placing the second electronic component above the first electronic component,
wherein the melting the solder further includes using the joint member to join to the third member the second electronic component that moves with the second members guided by the first members in the direction such that the second electronic component moves away from the first electronic component.

13. The method of manufacturing the electronic device according to claim 12,
wherein the joint member is a thermosetting resin having a setting temperature that is higher than a melting point of the solder or a thermoplastic resin having a softening temperature that is higher than the melting point of the solder.

14. The method of manufacturing the electronic device according to claim 8,
wherein the placing the second electronic component above the first electronic component includes interposing spacers between the first surface and the second surface.

* * * * *